United States Patent
Poulsen

(10) Patent No.: US 8,848,947 B2
(45) Date of Patent: Sep. 30, 2014

(54) LOW-NOISE MICROPHONE PRE-AMPLIFIER WITH ACTIVE LOAD ELEMENT

(75) Inventor: Jens Kristian Poulsen, Kitchener (CA)

(73) Assignee: BlackBerry Limited, Waterloo, Ontario (CA)

( * ) Notice: Subject to any disclaimer, the term of this patent is extended or adjusted under 35 U.S.C. 154(b) by 517 days.

(21) Appl. No.: 13/173,181

(22) Filed: Jun. 30, 2011

(65) Prior Publication Data

US 2013/0003995 A1 Jan. 3, 2013

(51) Int. Cl.
*H03F 99/00* (2009.01)
*H03F 3/187* (2006.01)
*H03F 1/02* (2006.01)
*H03F 1/22* (2006.01)

(52) U.S. Cl.
CPC ............... *H03F 1/223* (2013.01); *H03F 3/187* (2013.01); *H03F 1/0272* (2013.01); *H03F 2200/03* (2013.01)
USPC ........... 381/121; 381/111; 381/112; 381/113; 381/114; 381/115; 381/61; 381/26; 381/91; 381/92; 381/120; 381/122; 330/260; 330/308

(58) Field of Classification Search
USPC ......... 381/111–115, 61, 26, 91–92, 120, 122, 381/121; 330/260, 308
See application file for complete search history.

(56) References Cited

U.S. PATENT DOCUMENTS

| | | | |
|---|---|---|---|
| 4,317,083 A * | 2/1982 | Boyd | 330/296 |
| 6,064,269 A * | 5/2000 | Ruppel et al. | 330/297 |
| 6,580,797 B1 * | 6/2003 | Papadopoulos et al. | 381/111 |
| 7,787,642 B2 * | 8/2010 | Baker et al. | 381/113 |
| 2011/0311080 A1 * | 12/2011 | Jaar et al. | 381/174 |
| 2012/0250881 A1 * | 10/2012 | Mulligan | 381/92 |

OTHER PUBLICATIONS

Daniels et al; sequencing power supplies in multiple voltage rail environments, 2005.*

* cited by examiner

Primary Examiner — Davetta W Goins
Assistant Examiner — Kuassi Ganmavo
(74) Attorney, Agent, or Firm — Bereskin & Parr LLP

(57) ABSTRACT

A low-noise pre-amplifier with an active load element is integrated into a microphone. The microphone has an acoustic sensor coupled to the intrinsic pre-amplifier. A controllable current source is coupled to the intrinsic pre-amplifier and supplies a pre-amplifier bias current. A current source controller is coupled to the current source and controls the amplitude of the pre-amplifier bias current to maintain the intrinsic pre-amplifier at a bias point at which the intrinsic pre-amplifier amplifies microphone signals produced by the acoustic sensor. The intrinsic pre-amplifier may be actively regulated at the pre-determined bias point using negative feedback. Alternatively, the intrinsic pre-amplifier may be set to the pre-determined bias point by sweeping the pre-amplifier bias current for the intrinsic pre-amplifier over a range of currents. Use of an active load element with the intrinsic pre-amplifier results in lower noise, lower supply current, increased power supply suppression ratio and reduced signal post-processing.

12 Claims, 13 Drawing Sheets

US 8,848,947 B2

LOW-NOISE MICROPHONE PRE-AMPLIFIER WITH ACTIVE LOAD ELEMENT

FIELD

The described embodiments relate to a low-noise microphone pre-amplifier with an active load element that is suitable for use in a battery-powered mobile device.

INTRODUCTION

A microphone is an acoustic-to-electric transducer or sensor that converts audio sound waves into an electrical audio signal. Microphones are commonly used in many different applications such as telephones and other voice transmitters, tape recorders, audio engineering, radios, radio and television broadcasting, as well as in computers for recording voice speech recognition, Voice over IP (VoIP), and many other uses or applications.

Different microphone types also exist and are constructed using different principles of operation that in some way produce an electrical voltage or current signal from mechanical vibration caused by reception of audio sound waves. For example, dynamic microphones make use of electromagnetic induction to produce the electrical audio signal. On the other hand, condenser microphones use capacitance change for the same purpose. Piezoelectric generation and light modulation are also possible as well.

Electret microphones are a particular type of condenser microphone that have been developed and, due to their relatively good performance and competitive cost, are now widely used in computers, personal data assistants, headsets and other portable communication devices. An electret microphone typically includes a microphone capsule formed using a thin film or layer of electret material containing a permanently embedded (or polarized) static electric charge. Received audio sound wave cause mechanical fluctuations in the electret layer, which modulate the effective capacitance of, and therefore also the voltage appearing across, the electret layer. As the electrical voltage produced by the electret layer is often small, one or more amplifiers and other signal processing devices, such as filters, are often included downstream of the microphone capsule for generating usable audio signals.

BRIEF DESCRIPTION OF THE DRAWINGS

For a better understanding of the described embodiments and to show more clearly how they may be carried into effect, reference will now be made, by way of example, to the accompanying drawings in which.

DETAILED DESCRIPTION OF EMBODIMENTS

Figure 1:
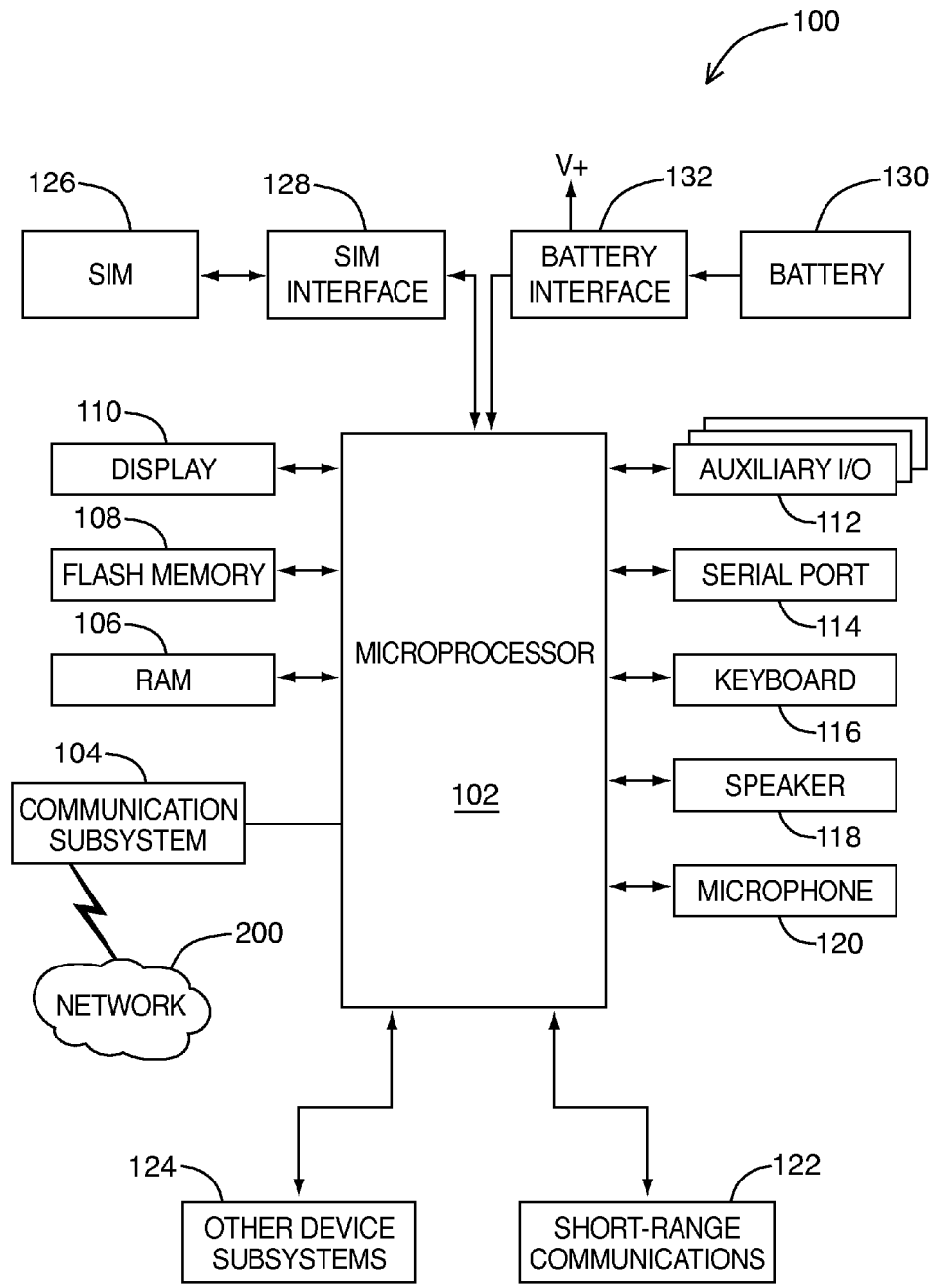
FIG. 1 is a block diagram of a mobile device in one example implementation.

The described embodiments generally make use of a mobile station. A mobile station may be a two-way communication device with advanced data communication capabilities having the capability to communicate with other computer systems and devices, and is also referred to herein generally as a mobile device. The mobile device may include the capability for voice communications, data communications or a combination of the two. Depending on the functionality provided by a mobile device, it may be referred to as a data messaging device, a two-way pager, a cellular telephone with data messaging capabilities, a wireless Internet appliance, a media player (such as an MP3 player) or a data communication device (with or without telephony capabilities).

According to one broad aspect, there is provided a mobile device having a processor for controlling operation of the mobile device, a communication subsystem coupled to the processor, and a microphone system for generating a pre-amplified microphone signal to be encoded and transmitted over a network by the communication subsystem. The microphone system includes a microphone, a current source and a current source controller. The microphone has an acoustic sensor for generating a microphone signal representative of an acoustic signal detected in a vicinity of the microphone, and an intrinsic pre-amplifier having an input terminal coupled to the acoustic sensor to receive the microphone signal and configured to generate the pre-amplified microphone signal at an output terminal of the intrinsic pre-amplifier. The current source is coupled to the intrinsic pre-amplifier for supplying the intrinsic pre-amplifier with a pre-amplifier bias current. The current source controller is coupled to the current source and configured to control the pre-amplifier bias current supplied by the current source based on a measured operating characteristic of the intrinsic pre-amplifier to maintain the intrinsic pre-amplifier at a predetermined bias point at which the intrinsic pre-amplifier generates the pre-amplified microphone signal by amplification of the microphone signal.

In some embodiments, the intrinsic pre-amplifier has a microphone transistor, and the predetermined bias point is a dc bias voltage at which the microphone transistor operates in a saturation region.

In some embodiments, the current source has one or more voltage-controlled current sources configured to generate the pre-amplifier bias current in response to a voltage control signal generated by the current source controller based on the measured operating characteristic.

In some embodiments, the current source controller has an error signal generator and an integrator. The error signal generator may be coupled to the output terminal of the intrinsic pre-amplifier and configured to generate an error signal representing a difference between the predetermined bias point of the intrinsic pre-amplifier and the measured operating characteristic. The integrator may be coupled to the error signal generator and the current source and may be configured to generate the voltage control signal for the current source by integrating the error signal. The integrator may have an integration frequency below a frequency range of the pre-amplified microphone signal to stabilize the intrinsic pre-amplifier at the predetermined bias point.

In some embodiments, the current source controller comprises a reference voltage generator, a resistor, a capacitor and an op-amp. The reference voltage generator provides a reference voltage representing the predetermined bias point of the intrinsic pre-amplifier. The resistor has a first node and a second node, with the first node coupled to the reference voltage generator. The capacitor has a third node and a fourth node, with the third node of the capacitor coupled to the second node of the resistor. The op-amp has a positive input terminal coupled to the output terminal of the intrinsic pre-amplifier, a negative input terminal coupled to the second node of the resistor and to the third node of the capacitor, and an op-amp output terminal coupled to the fourth node of the capacitor and to the current source for providing the voltage control signal.

In some embodiments, the current source controller has a feedback sensor and a variable voltage supply. The feedback sensor may be coupled to the output terminal of the intrinsic pre-amplifier for comparing the measured operating characteristic of the intrinsic pre-amplifier against the predetermined bias point. The variable voltage supply may be coupled to the feedback sensor and the current source, and may be configured to generate the voltage control signal for the current source by sweeping the voltage control signal across a range of set voltages until the feedback sensor indicates that the measured operating characteristic of the intrinsic pre-amplifier has achieved the predetermined bias point.

In some embodiments, the current source controller further includes a sweep sequencer coupled to the variable voltage supply and configured, upon detecting power on of the mobile device, to reset the voltage control signal to an initial set voltage and initiate the sweeping of the voltage control signal across the range of set voltages.

In some embodiments, the current source controller includes a digital counter for outputting a digital count value and a digital to analog converter. The digital counter is configured to reset the digital count value to an initial value when the sweeping of the voltage control signal is initiated, and to hold the digital count value at a final value when the measured operating characteristic of the intrinsic pre-amplifier has achieved the predetermined bias point. The digital to analog converter may be coupled to the digital counter for converting the digital count value outputted by the digital counter into the voltage control signal.

In some embodiments, the current source controller includes a feedback sensor and a switch network coupled to the current source for generating the voltage control signal. The feedback sensor may be coupled to the output terminal of the intrinsic pre-amplifier for comparing the measured operating characteristic of the intrinsic pre-amplifier against the predetermined bias point. The voltage control signal generated by the switch network may include a plurality of switch control signals for correspondingly controlling a plurality of voltage-controlled current sources in the current source. The switch network may be configured to sweep the pre-amplifier bias current across a range of currents by sequentially controlling individual voltage-controlled current sources in the plurality of voltage-controlled current sources, using the plurality of switch control signals, to supply corresponding incremental pre-amplifier bias currents to the intrinsic pre-amplifier until the feedback sensor indicates that the measured operating characteristic of the intrinsic pre-amplifier has achieved the predetermined bias point.

In some embodiments, the current source controller includes a sweep sequencer coupled to the switch network and configured, upon detecting power on of the mobile device, to reset each of the plurality of switch control signals to an off level at which the plurality of voltage-controlled current sources are non-conducting, and to initiate sweeping of the pre-amplifier bias current across the range of currents.

According to another broad aspect, there is provided a microphone system for a mobile device. The microphone system includes a microphone, a current source and a current source controller. The microphone has an acoustic sensor for generating a microphone signal representative of an acoustic signal detected in a vicinity of the microphone, and an intrinsic pre-amplifier having an input terminal coupled to the acoustic sensor to receive the microphone signal and configured to generate the pre-amplified microphone signal at an output terminal of the intrinsic pre-amplifier. The current source is coupled to the intrinsic pre-amplifier for supplying the intrinsic pre-amplifier with a pre-amplifier bias current. The current source controller is coupled to the current source and configured to control the pre-amplifier bias current supplied by the current source based on a measured operating characteristic of the intrinsic pre-amplifier to maintain the intrinsic pre-amplifier at a predetermined bias point at which the intrinsic pre-amplifier generates the pre-amplified microphone signal by amplification of the microphone signal.

In some embodiments, the intrinsic pre-amplifier has a microphone transistor, and the predetermined bias point is a dc bias voltage at which the microphone transistor operates in a saturation region.

In some embodiments, the current source has one or more voltage-controlled current sources configured to generate the pre-amplifier bias current in response to a voltage control signal generated by the current source controller based on the measured operating characteristic.

In some embodiments, the current source controller has an error signal generator and an integrator. The error signal generator may be coupled to the output terminal of the intrinsic pre-amplifier and configured to generate an error signal representing a difference between the predetermined bias point of the intrinsic pre-amplifier and the measured operating characteristic. The integrator may be coupled to the error signal generator and the current source and may be configured to generate the voltage control signal for the current source by integrating the error signal. The integrator may have an integration frequency below a frequency range of the pre-amplified microphone signal to stabilize the intrinsic pre-amplifier at the predetermined bias point.

In some embodiments, the current source controller comprises a reference voltage generator, a resistor, a capacitor and an op-amp. The reference voltage generator provides a reference voltage representing the predetermined bias point of the intrinsic pre-amplifier. The resistor has a first node and a second node, with the first node coupled to the reference voltage generator. The capacitor has a third node and a fourth node, with the third node of the capacitor coupled to the second node of the resistor. The op-amp has a positive input terminal coupled to the output terminal of the intrinsic pre-amplifier, a negative input terminal coupled to the second node of the resistor and to the third node of the capacitor, and an op-amp output terminal coupled to the fourth node of the capacitor and to the current source for providing the voltage control signal.

In some embodiments, the current source controller has a feedback sensor and a variable voltage supply. The feedback sensor may be coupled to the output terminal of the intrinsic pre-amplifier for comparing the measured operating characteristic of the intrinsic pre-amplifier against the predetermined bias point. The variable voltage supply may be coupled to the feedback sensor and the current source, and may be configured to generate the voltage control signal for the current source by sweeping the voltage control signal across a range of set voltages until the feedback sensor indicates that the measured operating characteristic of the intrinsic pre-amplifier has achieved the predetermined bias point.

In some embodiments, the current source controller further includes a sweep sequencer coupled to the variable voltage supply and configured, upon detecting power on of the mobile device, to reset the voltage control signal to an initial set voltage and initiate the sweeping of the voltage control signal across the range of set voltages.

In some embodiments, the current source controller includes a digital counter for outputting a digital count value and a digital to analog converter. The digital counter is configured to reset the digital count value to an initial value when the sweeping of the voltage control signal is initiated, and to hold the digital count value at a final value when the measured operating characteristic of the intrinsic pre-amplifier has achieved the predetermined bias point. The digital to analog converter may be coupled to the digital counter for converting the digital count value outputted by the digital counter into the voltage control signal.

In some embodiments, the current source controller includes a feedback sensor and a switch network coupled to the current source for generating the voltage control signal. The feedback sensor may be coupled to the output terminal of the intrinsic pre-amplifier for comparing the measured operating characteristic of the intrinsic pre-amplifier against the predetermined bias point. The voltage control signal generated by the switch network may include a plurality of switch control signals for correspondingly controlling a plurality of voltage-controlled current sources in the current source. The switch network may be configured to sweep the pre-amplifier bias current across a range of currents by sequentially controlling individual voltage-controlled current sources in the plurality of voltage-controlled current sources, using the plurality of switch control signals, to supply corresponding incremental pre-amplifier bias currents to the intrinsic pre-amplifier until the feedback sensor indicates that the measured operating characteristic of the intrinsic pre-amplifier has achieved the predetermined bias point.

In some embodiments, the current source controller includes a sweep sequencer coupled to the switch network and configured, upon detecting power on of the mobile device, to reset each of the plurality of switch control signals to an off level at which the plurality of voltage-controlled current sources are non-conducting, and to initiate sweeping of the pre-amplifier bias current across the range of currents.

Figure 2:
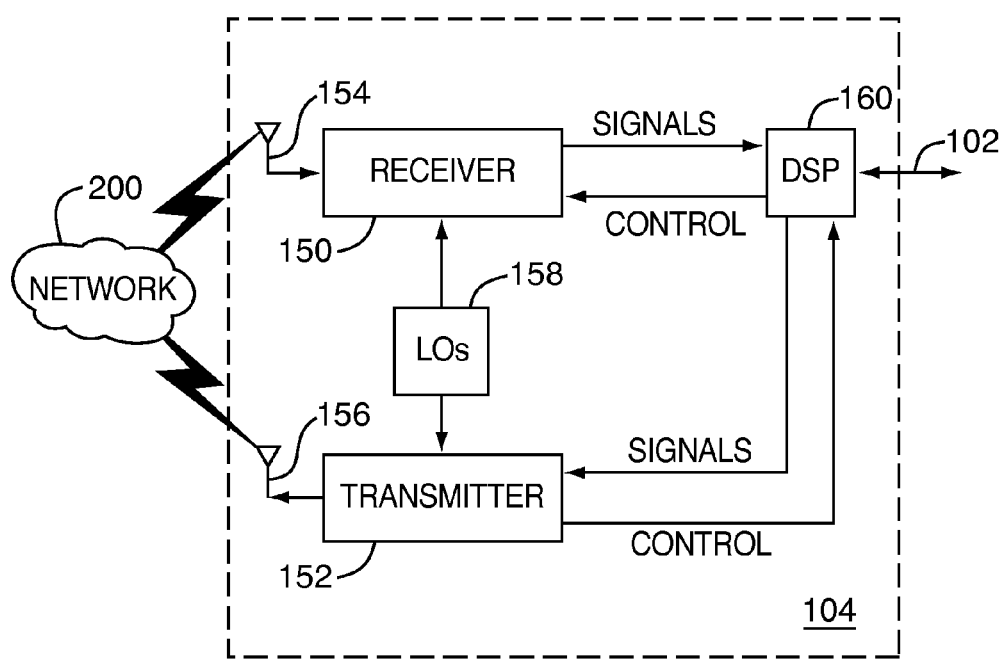
FIG. 2 is a block diagram of a communication sub-system component of the mobile device of FIG. 1.
Figure 3:
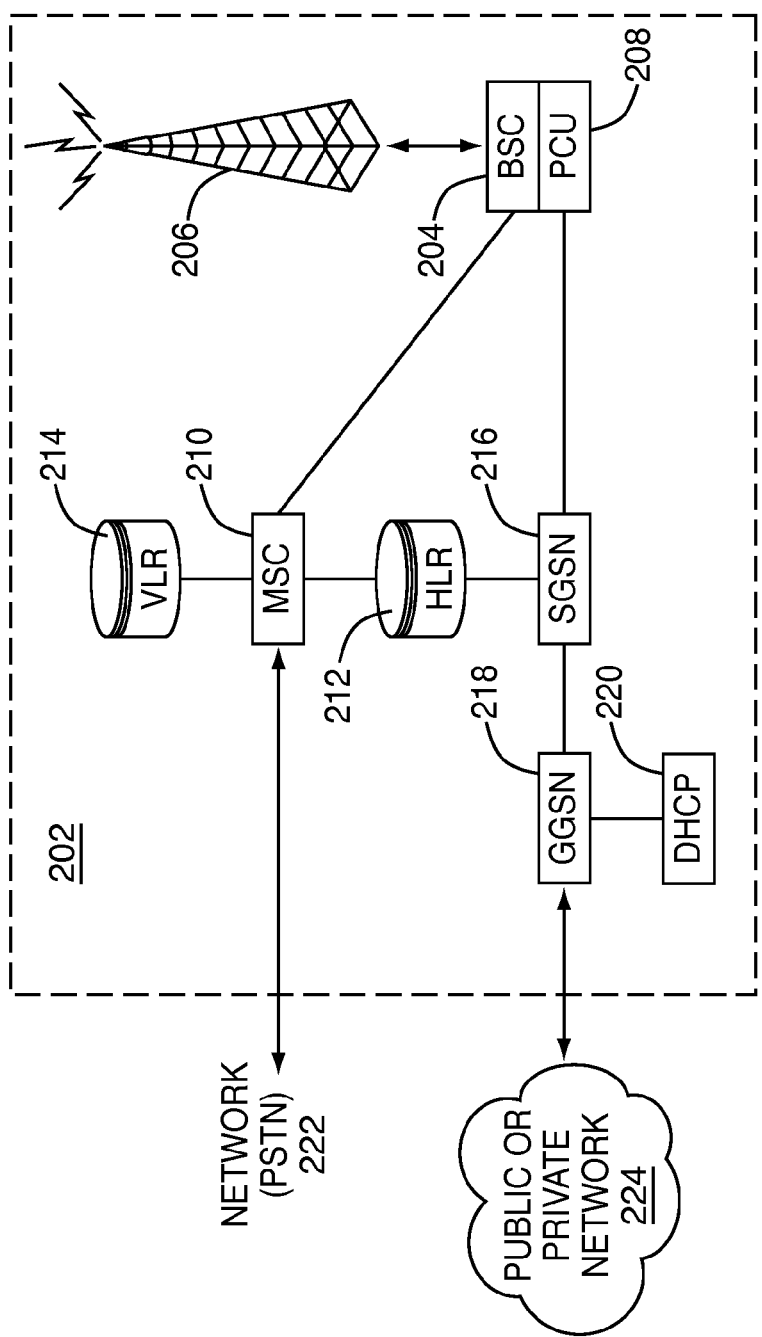
FIG. 3 is a block diagram of a node of a wireless network.

Reference is first made to FIGS. 1 to 3 for a general description of the structure of a mobile device and how the mobile device operates and communicates with other devices.

Referring specifically to FIG. 1, a block diagram of a mobile device 100 in one example implementation is shown generally. Mobile device 100 comprises a number of components, the controlling component being microprocessor 102. Microprocessor 102 controls the overall operation of mobile device 100. In some embodiments, certain communication functions, including data and voice communications, are performed through communication subsystem 104. Communication subsystem 104 receives messages from and sends messages to a network 200 wirelessly.

In this example implementation of mobile device 100, communication subsystem 104 is configured for cellular communication in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS).

New standards are still being defined, but it is believed that they will have similarities to the network behavior described herein, and it will also be understood by persons skilled in the art that the described embodiments are intended to use any other suitable standards that are developed in the future. The wireless link that connects communication subsystem 104 with network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network associated with mobile device 100 is a GSM/GPRS wireless network in one example implementation of mobile device 100, other wireless networks may also be associated with mobile device 100 in variant implementations. Different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and third-generation (3G) networks like EDGE and UMTS. Some older examples of data-centric networks include the Mobitex™ Radio Network and the DataTAC™ Radio Network. Examples of older voice-centric data networks include Personal Communication Systems (PCS) networks like GSM and Time Division Multiple Access (TDMA) systems.

Microprocessor 102 also interacts with additional subsystems such as a Random Access Memory (RAM) 106, flash memory 108, display 110, auxiliary input/output (I/O) subsystem 112, serial port 114, keyboard 116, speaker 118, microphone 120, short-range communications subsystem 122 and other device subsystems 124.

Some of the subsystems of mobile device 100 perform communication-related functions, whereas other subsystems may provide "resident" or on-device functions. By way of example, display 110 and keyboard 116 may be used for both communication-related functions, such as entering a text message for transmission over network 200, and device-resident functions such as a calculator, media player or task list. Operating system software used by microprocessor 102 is typically stored in a persistent store such as flash memory 108, which may alternatively be a read-only memory (ROM) or similar storage element (not shown). Those skilled in the art will appreciate that the operating system, specific device applications, or parts thereof, may be temporarily loaded into a volatile store such as RAM 106.

In some embodiments, mobile device 100 may send and receive communication signals over network 200 after required network registration or activation procedures have been completed. Network access is associated with a subscriber or user of a mobile device 100. To identify a subscriber, mobile device 100 requires a Subscriber Identity Module or "SIM" 126 to be inserted in a SIM interface 128 in order to communicate with a network. SIM 126 is one type of a conventional "smart card" used to identify a subscriber of mobile device 100 and to personalize the mobile device 100, among other things. Without SIM 126, mobile device 100 is not fully operational for communication with network 200.

By inserting SIM 126 into SIM interface 128, a subscriber can access all subscribed services. Services could include: web browsing and messaging such as e-mail, voice mail, Short Message Service (SMS), media transfers (such as music downloading or streaming), and Multimedia Messaging Services (MMS). More advanced services may include: point of sale, field service and sales force automation. SIM 126 includes a processor and memory for storing information. Once SIM 126 is inserted in SIM interface 128, it is coupled to microprocessor 102. In order to identify the subscriber, SIM 126 contains some user parameters such as an International Mobile Subscriber Identity (IMSI). An advantage of using SIM 126 is that subscribers are not necessarily bound by any single physical mobile device. SIM 126 may store additional subscriber information for a mobile device as well, including datebook (or calendar) information and recent call information. In certain embodiments SIM 126 may be a different type of user identifier and may be integral to mobile device 100 or not present at all.

Mobile device 100 is a battery-powered device and includes a battery interface 132 for receiving rechargeable battery 130 or alternatively more than one rechargeable battery. Battery interface 132 is coupled to a regulator (not shown), which assists rechargeable battery 130 in providing power V+ to mobile device 100. Although current technology makes use of a battery, future technologies such as micro fuel cells may provide the power to mobile device 100.

Microprocessor 102, in addition to its operating system functions, enables execution of software applications on mobile device 100. A set of applications that control basic device operations, including data and voice communication applications, will normally be installed in flash memory 108 (or other non-volatile storage) on mobile device 100 during its manufacture.

Additional applications may also be loaded onto mobile device 100 through network 200, auxiliary I/O subsystem 112, serial port 114, short-range communications subsystem 122, or any other of the device subsystems 124. This flexibility in application installation increases the functionality of mobile device 100 and may provide enhanced on-device functions, communication-related functions, or both. For example, secure communication applications may enable electronic commerce functions and other such financial transactions to be performed using mobile device 100.

Serial port 114 enables a subscriber to set preferences through an external device or software application and extends the capabilities of mobile device 100 by providing for information or software downloads to mobile device 100 other than through a wireless communication network. The alternate download path may, for example, be used to load an encryption key onto mobile device 100 through a direct and thus reliable and trusted connection to provide secure device communication.

Short-range communications subsystem 122 provides for wireless device connections to enable communication between mobile device 100 and different systems or devices, without the use of network 200. For example, short-range communications subsystem 122 may include an infrared device and associated circuits and components for short-range communication. Examples of short range communication would include standards developed by the Infrared Data Association (IrDA), Bluetooth, and the 802.11 family of standards developed by IEEE.

In use, a received signal such as a text message, an e-mail message, or web page download will be processed by communication subsystem 104 and input to microprocessor 102. Microprocessor 102 will then process the received signal for output to display 110 or alternatively to auxiliary I/O subsystem 112. A subscriber may also compose data items, such as e-mail messages, for example, using keyboard 116 in conjunction with display 110 and possibly also the auxiliary I/O subsystem 112. Auxiliary I/O subsystem 112 may include devices such as: a touch screen, mouse, infrared fingerprint detector, or a roller wheel with a dynamic button pressing capability. Further, auxiliary I/O subsystem 112 may comprise a two-dimensional navigation (or scrolling) component, such as a track ball, a joystick or a directional pad, each optionally with a dynamic button pressing capability. Keyboard 116 is an alphanumeric keyboard and/or telephone-type keypad. A composed item may be transmitted over network 200 through communication subsystem 104.

For voice communications, the overall operation of mobile device 100 is substantially similar, except that the received signals would be output to speaker 118, and signals for transmission would be generated by microphone 120. Alternative voice or audio I/O subsystems, such as a voice message recording subsystem, may also be implemented on mobile device 100. Although voice or audio signal output is accomplished primarily through speaker 118, display 110 may also be used to provide additional information such as the identity of a calling party, duration of a voice call, or other voice call related information. Microphone 120 can be biased using a low noise linear regulator that receives power from the rechargeable battery 130 across the battery interface 132. Different types and configurations of microphone 120 can be incorporated into the mobile device 100, including microphones having a low noise microphone pre-amplifier with an active load element, as will be described more below.

Referring now to FIG. 2, a block diagram of the communication subsystem 104 of FIG. 1 is shown. Communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of communication subsystem 104 is dependent upon the network 200 in which mobile device 100 is intended to operate, thus it should be understood that the design illustrated in FIG. 2 serves only as one example. Signals received by antenna 154 through network 200 are input to receiver 150, which may perform such common receiver functions as signal amplification, frequency down conversion, filtering, channel selection, and analog-to-digital (A/D) conversion. A/D conversion of a received signal allows more complex communication functions such as demodulation and decoding to be performed in DSP 160. In a similar manner, signals to be transmitted are processed, including modulation and encoding, by DSP 160. These DSP-processed signals are input to transmitter 152 for digital-to-analog (D/A) conversion, frequency up conversion, filtering, amplification and transmission over network 200 via antenna 156. DSP 160 not only processes communication signals, but also provides for receiver and transmitter control. For example, the gains applied to communication signals in receiver 150 and transmitter 152 may be adaptively controlled through automatic gain control algorithms implemented in DSP 160.

The wireless link between mobile device 100 and a network 200 may contain one or more different channels, typically different RF channels, and associated protocols used between mobile device 100 and network 200. A RF channel is a limited resource that must be conserved, typically due to limits in overall bandwidth and limited battery power of mobile device 100.

When mobile device 100 is fully operational, transmitter 152 is typically keyed or turned on only when it is sending to network 200 and is otherwise turned off to conserve resources. Similarly, receiver 150 is periodically turned off to conserve power until it is needed to receive signals or information (if at all) during designated time periods.

Referring now to FIG. 3, a block diagram of a node of a wireless network is shown as 202. In practice, network 200 comprises one or more nodes 202. Mobile device 100 communicates with a node 202 within network 200. In the example implementation of FIG. 3, node 202 is configured in accordance with General Packet Radio Service (GPRS) and Global Systems for Mobile (GSM) technologies. Node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through network 200.

In a GSM network, MSC 210 is coupled to BSC 204 and to a landline network, such as a Public Switched Telephone Network (PSTN) 222 to satisfy circuit switched requirements. The connection through PCU 208, SGSN 216 and GGSN 218 to the public or private network (Internet) 224 (also referred to herein generally as a shared network infrastructure) represents the data path for GPRS capable mobile devices. In a GSM network extended with GPRS capabilities, BSC 204 also contains a Packet Control Unit (PCU) 208 that connects to SGSN 216 to control segmentation, radio channel allocation and to satisfy packet switched requirements. To track mobile device location and availability for both circuit switched and packet switched management, HLR 212 is shared between MSC 210 and SGSN 216. Access to VLR 214 is controlled by MSC 210.

Station 206 is a fixed transceiver station. Station 206 and BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from mobile device 100 within its cell. Communication protocols and parameters may vary between different nodes. For example, one node may employ a different modulation scheme and operate at different frequencies than other nodes.

For all mobile devices registered with a specific network, which may include mobile device 100, permanent configuration data such as a user profile is stored in HLR 212. HLR 212 also contains location information for each registered mobile device and can be queried to determine the current location of a mobile device. MSC 210 is responsible for a group of location areas and stores the data of the mobile devices currently in its area of responsibility in VLR 214. Further VLR 214 also contains information on mobile devices that are visiting other networks. The information in VLR 214 includes part of the permanent mobile device data transmitted from HLR 212 to VLR 214 for faster access. By moving additional information from a remote HLR 212 node to VLR 214, the amount of traffic between these nodes can be reduced so that voice and data services can be provided with faster response times and at the same time requiring less use of computing resources.

SGSN 216 and GGSN 218 are elements added for GPRS support; namely packet switched data support, within GSM. SGSN 216 and MSC 210 have similar responsibilities within network 200 by keeping track of the location of each mobile device 100. SGSN 216 also performs security functions and access control for data traffic on network 200. GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring a DHCP server 220 connected to the GGSN 218. There are many mechanisms for dynamic IP assignment, including using a combination of a Remote Authentication Dial-In User Service (RADIUS) server and DHCP server 220.

Once the GPRS Attach is complete, a logical connection is established from a mobile device 100, through PCU 208, and SGSN 216 to an Access Point Node (APN) within GGSN 218. The APN represents a logical end of an IP tunnel that can either access direct Internet compatible services or private network connections. The APN also represents a security mechanism for network 200, insofar as each mobile device 100 must be assigned to one or more APNs and each mobile device 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and all traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, network 200 will run an idle timer for each PDP Context to determine if there is a lack of activity. When a mobile device 100 is not using its PDP Context, the PDP Context can be deallocated and the IP address returned to the IP address pool managed by the DHCP server 220.

Figure 4:
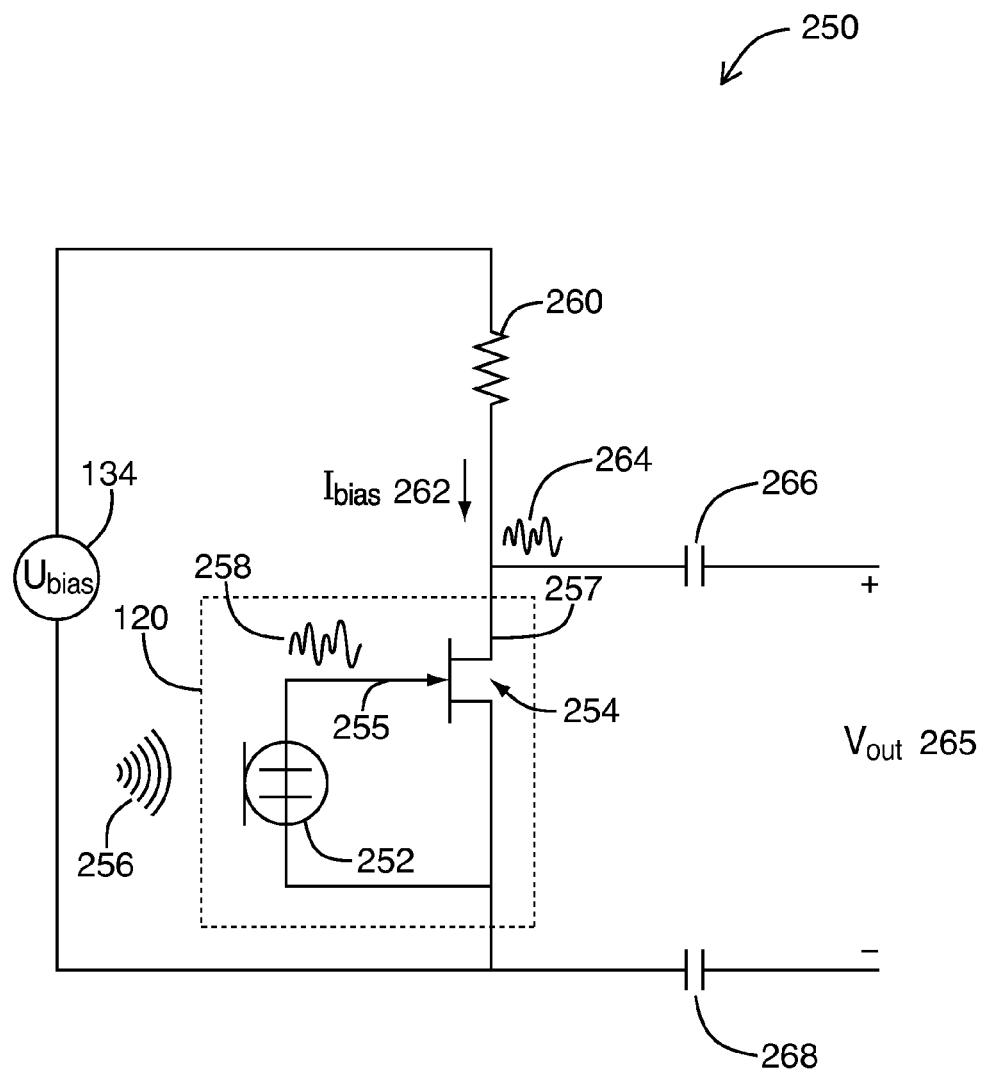
FIG. 4 is a block diagram of a microphone system that utilizes passive microphone biasing elements.

Referring now to FIG. 4, there is illustrated a microphone system 250 incorporating a bias circuit for a microphone according to a typical configuration. In this example implementation, the microphone 120 (or alternatively "microphone module") comprises an acoustic sensor 252 and an intrinsic pre-amplifier 254 integrated or otherwise incorporated within the microphone 120. The acoustic sensor 252 operates as an electro-acoustic transducer within the microphone 120 by detecting an acoustic signal 256 propagating in the vicinity of the microphone 120 and generating a microphone signal 258 in response. Accordingly, the acoustic signal 256 may be any sound wave having modulated sound pressure variations, and the microphone signal 258 may be a small, time varying electrical signal that is representative of the acoustic signal 256. In some embodiments, the acoustic sensor 252 may be implemented using an electret diaphragm that fluctuates about a rest position in the presence of sound pressure modulation.

While the acoustic sensor 252 is described in this example implementation as an electret diaphragm, it should be appreciated that other types or configurations for the microphone 120 are possible as well. For example, microphone 120 could be any microphone within a general class of condenser microphones, in which case the acoustic sensor 252 could be replaced with a plate capacitor maintained at a bias voltage to generate a static charge across the capacitor plates. A suitable voltage divider or voltage regulator circuit could be used to generate the plate capacitor bias voltage, which in such cases could function similar to the embedded static charge in an electret diaphragm.

The microphone signal 258 is provided to an input terminal 255 of the intrinsic pre-amplifier 254, which is illustrated in FIG. 4 as a single transistor. In electret and other condenser microphones, the single transistor is commonly a field effect transistor, such as a junction field effect transistor (JFET) or a metal oxide semiconductor field effect transistor (MOSFET), which has relatively high input impedance so as not to load the acoustic sensor 252 significantly. However, in alternative configurations, the single transistor used to implement the intrinsic pre-amplifier 254 may also be another suitable transistor type, such as a bipolar junction transistor (BJT). In further alternative configurations, the intrinsic pre-amplifier 254 may be implemented using a combination of two or more transistors of any suitable type and in any suitable configuration. However, for convenience, it will be assumed that the intrinsic pre-amplifier 254 is a single JFET, in which case the input terminal 255 may also be referred to as a gate terminal or simply "gate".

If the JFET used to implemented the intrinsic pre-amplifier 254 is biased in the saturation region of operation, then the current flowing through the intrinsic pre-amplifier 254 will be roughly proportional to the effective drive voltage applied to the input terminal 255. The intrinsic pre-amplifier 254 acts as an impedance transformer allowing a high impedance transducer (e.g. the microphone 120) to drive relatively low input impedance circuits connected downstream of the microphone 120. The intrinsic pre-amplifier 254 can also behave like an amplifier with a certain voltage gain factor. Accordingly, modulating the gate voltage of the intrinsic pre-amplifier 254 with the microphone signal 258 will cause a voltage 264 to be generated at an output terminal 257 of the intrinsic pre-amplifier 254. In the case of a JFET used to implement the intrinsic pre-amplifier 254, the output terminal 257 may for convenience be referred to as a drain terminal or simply "drain". The voltage 264 appearing instantaneously at the output terminal 257 can include both a dc component representing a bias voltage for the intrinsic pre-amplifier 254 and a time varying component representing the voltage induced by the microphone signal 258. Decoupling capacitors 266 and 268 can be used to sense an output signal 265 by removing the transistor dc bias component from the voltage 264 to leave substantially only the time varying component contributed by the microphone signal 258. In this way, the output signal 265 may be a time-varying electrical signal representing an amplified version of the microphone signal 258.

In the microphone system 250, the intrinsic pre-amplifier 254 is biased using a bias resistor 260 and a suitable power supply, which can be a linear regulator 134 having low noise characteristics. While the microphone system 250 is designed for use in the mobile device 100, it will be appreciated that the microphone system 250 is not restricted to the mobile device 100 and that other types or configurations of power supplies may therefore be possible in addition to the linear regulator 134. The bias resistor 260 is connected to the output terminal 257 of the intrinsic pre-amplifier 254, such that the linear regulator 134 is connected across the series combination of the bias resistor 260 and the microphone 120. A pre-amplifier bias current 262 is supplied to the intrinsic pre-amplifier 254 by the bias resistor 260.

In this configuration, the bias resistor 260 is designed so that the pre-amplifier bias current 262 drives the transistor used to implement the intrinsic pre-amplifier 254 into the saturation region, wherein the transistor operates like a voltage controlled current source and, depending on other parameters of the microphone system 250, as an amplifier. However, the transistor within the intrinsic pre-amplifier 254 may at the same time still act as an impedance transformer as described above. The size of the bias resistor 260 is variable and, in order to bias the transistor within the intrinsic pre-amplifier 254 in the saturation region, can depend on the voltage level supplied by the linear regulator 134 and various physical parameters of the intrinsic pre-amplifier 254, such as threshold voltage, transconductance Gm, etc.

The microphone system 250 shown in FIG. 4 may in some cases be subject to certain design constraints. For example, significant distortion of the output signal 265 can be incurred if the voltage swing at the output terminal 257 is large enough that a minimum drain-source voltage required to keep the transistor within the intrinsic pre-amplifier 254 in the saturation region is not maintained and the transistor is thereby driven into out of saturation. To accommodate more voltage swing and maintain the transistor in saturation, a larger dc bias voltage can be supplied to the output terminal 257 of the intrinsic pre-amplifier 254 by selecting a smaller resistance for the bias resistor 260. However, selecting a smaller resistance for the bias resistor 260 tends to reduce or limit the available gain factor of the intrinsic pre-amplifier 254. In some cases, selection of a small enough resistance for the bias resistor 260 may even cause attenuation of the output signal 265 as compared to the microphone signal 258 at the gate terminal of intrinsic pre-amplifier 254 and may also result in the voltage supplied from the linear regulator 134 having a practical upper limit. Furthermore, increasing both the voltage output of the linear regulator 134 and the size of the bias resistor 260 while maintaining the same pre-amplifier bias current 262 will result in higher power consumption in the microphone system 250.

Additional amplifier gain without sacrificing output voltage swing can be achieved by increasing the voltage level of the linear regulator 134, thereby allowing for a larger resistance for the bias resistor 260 to be used in the microphone system 250. A larger bias voltage supplied to the transistor itself will normally also increase the transconductance Gm and, thereby, the gain factor of the intrinsic pre-amplifier 254. However, in many battery-powered devices, such as the mobile device 100, the available voltage supply from the device battery may be fixed. In many cases, for more efficient operation, the voltage supply level of the device battery will also be limited to the minimum required to operate the circuits of the mobile device 100, which in present technologies can be around 3.5V minus some margin and tending still lower in new generations of mobile devices. Given the constraints imposed on the microphone system 250 when configured for use in the mobile device 100, the intrinsic pre-amplifier 254 is often capable of achieving only modest or nominal gain. Increasing the available voltage supply to the linear regulator 134, for example using a charge pump, will also tend to increase power consumption in the microphone system 250.

In such cases, an amplifier is often provided downstream of the microphone system 250 to provide additional voltage amplification of the output signal 265. Depending on the achievable gain of the intrinsic pre-amplifier 254, the output signal 265 can still have relatively small amplitude compared to noise levels and, therefore, a low-noise pre-amplifier is usually necessary. This adds additional cost and complexity, as well as power consumption. In practice, the intrinsic pre-amplifier 254 is often used primarily to transform the output signal 265 from the microphone 120 with high impedance to an equivalent output signal with low output impedance and little to no signal gain.

At the same time, power signal rejection ratio (PSRR) can also be a relevant design consideration for the microphone system 250. The PSRR of the microphone system 250 refers to the ability of the microphone system 250 to reject noise from the power supply and prevent the power supply noise from appearing at the output of the microphone system 250. In the microphone system 250, the output signal 265 is measured across the output terminal of the intrinsic pre-amplifier 254 and the common node of the linear regulator 134 and intrinsic pre-amplifier 254 using decoupling capacitors 266 and 268. An incremental voltage change $\Delta V_{bat}$ at the positive terminal of the linear regulator 134 will cause a disturbance of approximately equal size to the bias point of the intrinsic pre-amplifier 254, since the intrinsic pre-amplifier 254 is operating like a current source with a relatively high output impedance.

Often the intrinsic pre-amplifier 254 is configured to provide essentially unity gain and thereby function primarily as an impedance converter. In such cases, where the intrinsic pre-amplifier 254 is configured to provide unity or only a nominal voltage gain between the microphone signal 258 and the output signal 265, the resulting distortion of the output signal 265 due to power supply noise may be substantial and result in a relatively low PSSR for the microphone system 250. Partly this is because the output signal 265 remains relatively small compared to the supply voltage noise and thus can have a relatively low signal to noise ratio.

Referring now to FIGS. 5A and 5B, there is illustrated a microphone system 300 for a microphone, in accordance with the described embodiments, which can be used as an alternative to the microphone system 250. The microphone system 300 has a similar configuration to the microphone system 250, except that the intrinsic pre-amplifier 254 is biased now using an active load, such as the current source 302, in place of the bias resistor 260. The current source 302 may be any circuit or combination of discrete components configured to supply a current of a pre-determined or desired amplitude and, in some cases, may be controllable so that the amplitude of the supplied current is variable. A current source controller 304 is also provided in a feedback loop 308 to properly bias the transistor within the intrinsic pre-amplifier 254 in the saturation region based on some measured operating characteristic of the intrinsic pre-amplifier 254. As explained more below, the measured operating characteristic of the intrinsic pre-amplifier 254 may be a dc bias voltage or, in some cases, a dc bias current, such as the pre-amplifier bias current 262.

Assuming the transistor within the intrinsic pre-amplifier 254 is properly biased in the saturation region, the achievable gain of the intrinsic pre-amplifier 254 can be substantially increased, for the same nominal supply voltage level of the linear regulator 134, by substituting an active load such as the current source 302 for a passive load such as the bias resistor 260. The extra gain is due to the fact that the output impedance of the current source 302 is generally much larger than the size of the bias resistor 260 for equivalent current flow. Therefore, the transistor gain can be determined as the transconductance Gm multiplied by the output impedance of the intrinsic pre-amplifier 254 in parallel with the output impedance of the current source 302. Since the output impedance of the current source 302 is normally much greater than the resistance of bias resistor 260, the transistor gain will increase considerably, typically by more than 20 dB. With the additional amplification of the microphone signal 258 provided when intrinsic pre-amplifier 254 is actively loaded, the PSSR of the microphone system 300 can be increased relative to the microphone system 250 by as much as 20 dB. This is because the microphone signal 258 is pre-amplified by the intrinsic pre-amplifier 254, while supply voltage noise is transferred to the output terminal 257 without amplification.

In some cases, the intrinsic pre-amplifier 254 can provide sufficient amplification of the microphone signal 258 that an additional, discrete amplifier downstream of the microphone system 300 may be omitted. In each of the microphone system 250 and the microphone system 300, the intrinsic pre-amplifier 254 is supplied with the pre-amplifier bias current 262. However, in microphone system 250, but not in microphone system 300, energy is dissipated in the bias resistor 260 as waste heat and not put toward pre-amplification of the microphone signal 258. The additional amplification achieved from using the current source 302 therefore comes at essentially no additional power cost, although some power may be consumed in the current source controller 304. This is also evident from the fact that elimination of the downstream amplifier can incur substantial power savings. This also makes very low noise operation possible because the microphone signal 258 is amplified right at source as opposed to in a discrete amplifier connected downstream of the microphone 120. These and other features of the microphone system 300 will now be explained in more detail.

The microphone system 300 comprises current source 302 coupled to the output terminal 257 of the intrinsic pre-amplifier 254, which can be the transistor drain terminal in some cases or can be the transistor source terminal in other cases. The current source 302 is controllable by the current source controller 304 to vary the magnitude of the pre-amplifier bias current 262 supplied to the intrinsic pre-amplifier 254. In some example implementations, the current source 302 can be a voltage controlled current source. For example, the current source 302 can comprise one or more transistors operating in the saturation region.

The current source controller 304 is coupled to a control input 306 of the current source 302 and also to the output terminal 257 of the intrinsic pre-amplifier 254 by way of feedback loop 308. The current source controller 304 monitors one or more instantaneous operating characteristics of the intrinsic pre-amplifier 254 and generates a current source control signal 310 based upon the monitored operating characteristic or characteristics. Accordingly, the current source controller 304 determines control values for the current source control signal 310 to maintain the intrinsic pre-amplifier 254 at a pre-determined bias point. In some embodiments, the bandwidth of the feedback loop 308 can be designed sufficiently low that operation of the feedback loop 308 does not affect the lowest frequency of interest in the microphone signal 258, which thereby prevents or minimizes distortion caused by the feedback loop 308. The pre-determined bias point of the intrinsic pre-amplifier 254 may represent the quiescent state of the intrinsic pre-amplifier 254, defined in terms of dc voltage or current, when the intrinsic pre-amplifier 254 is not actively operating as am amplifier.

For example, the operating characteristic of the intrinsic pre-amplifier 254 that is monitored by the current source controller 304 can be the output voltage 312 (i.e., transistor drain-source voltage) of the intrinsic pre-amplifier 254. However, in alternative configurations, the current source controller 304 can instead directly monitor the pre-amplifier bias current 262 supplied to the intrinsic pre-amplifier 254. The predetermined bias point at which the current source controller 304 maintains the intrinsic pre-amplifier 254 can be a dc bias voltage (or alternatively bias current) that maintains the transistor within the intrinsic pre-amplifier 254 in the saturation region and thereby operating as an amplifier with appreciable signal gain.

As will be explained further below, the current source controller 304 can also actively regulate the intrinsic pre-amplifier 254 to the pre-determined bias point using closed-loop feedback control. Alternatively, the current source controller 304 can periodically set the intrinsic pre-amplifier 254 to the pre-determined bias point using pseudo-open loop control that simply initializes the operating point of the intrinsic pre-amplifier 254 each period but without active regulation. The pre-determined bias point can also be selected to provide both top and bottom end margin to ensure that voltage swing at the output terminal 257 does not push the transistor within the intrinsic pre-amplifier 254 out of saturation.

Similar to the microphone system 250, the microphone 120 may comprise an acoustic sensor 252 configured to detect acoustic pressure changes caused by pressure modulation of the acoustic signal 256. The microphone signal 258 generated by the acoustic sensor 252 is supplied to the input terminal 255 of the intrinsic pre-amplifier 254, which may be biased intrinsically or using two diodes coupled back-to-back for a MOSFET or using some other circuit. Assuming the transistor within the intrinsic pre-amplifier 254 is operated in the saturation region, the intrinsic pre-amplifier 254 generates the pre-amplified microphone signal 316 as a time-varying electrical signal appearing at the output terminal 314 through amplification of the microphone signal 258. Thus, the output voltage 312 appearing at the output terminal 257 can include a component contributed by the pre-amplified microphone signal 316 superimposed onto the dc bias voltage of the intrinsic pre-amplifier 254. Again the decoupling capacitors 266 and 268 can be used to sense the pre-amplified microphone signal 316 by blocking the dc bias voltage and removing any ground offset thereby providing a differential output suitable for further signal processing.

In some embodiments, the microphone system 300, the pre-amplified microphone signal 316 may then be provided to one or more downstream components of the mobile device 100 (FIG. 1) for encoding and transmission over the network 200 (FIG. 2) by the communication subsystem 104 (FIG. 1). Alternatively, the pre-amplified microphone signal 316 may also be stored on the mobile device 100 for playback at a later time or for any other intended use. For example, the pre-amplified microphone signal 316 may represent a recorded signal for voice communications, dictations, voice-to-text applications, and the like.

Figure 5:
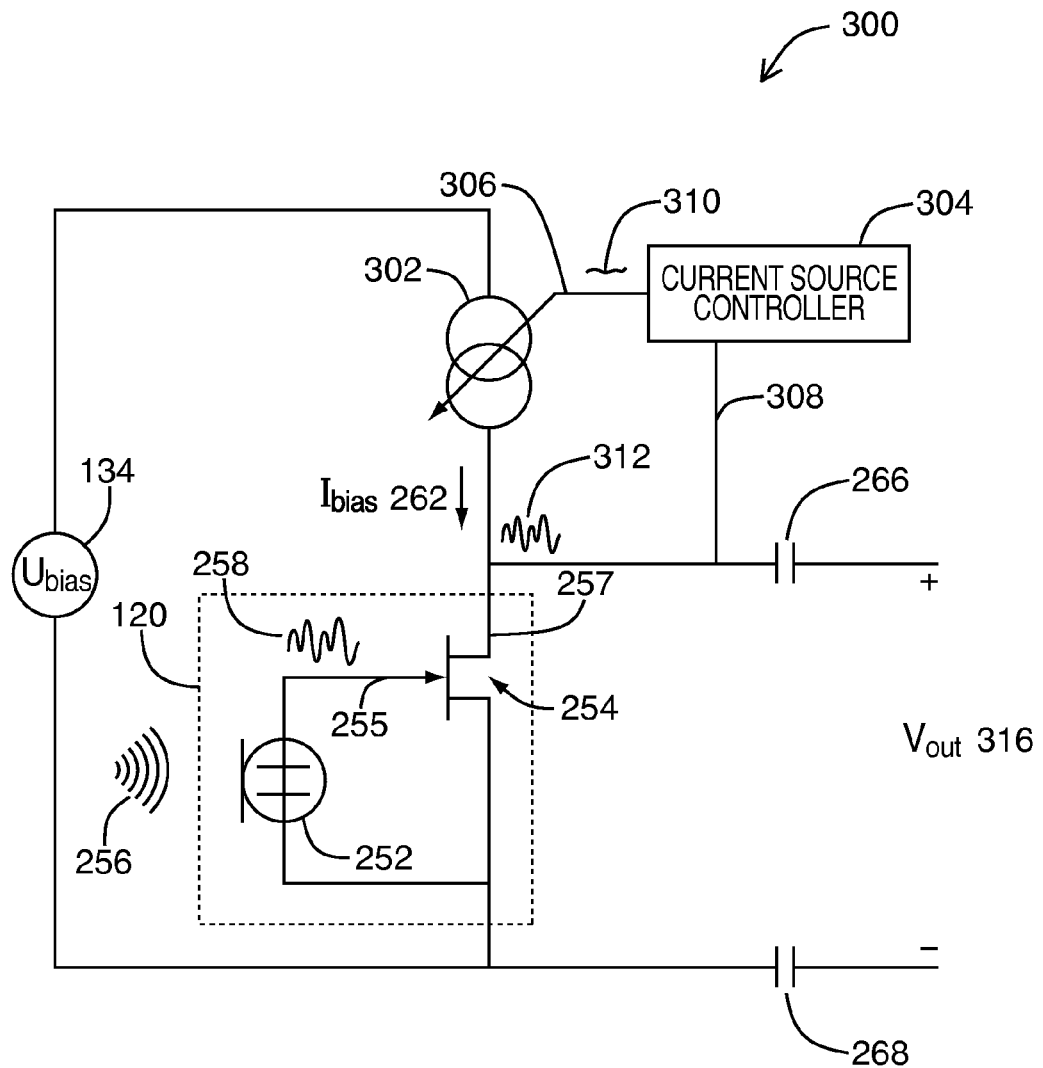
FIG. 5 is a block diagram of a microphone system having an integrated low noise microphone pre-amplifier with active load element.

Some variations to the microphone system 300 shown in FIG. 5 exist as well. For example, the output signal 265 could be sensed across the current source 302 rather than the intrinsic pre-amplifier 254. It is also possible to vary the respective connections of the current source 302 and the microphone 120 to the linear regulator 134, as well as the location of the feedback loop 308 within the microphone system 300. For example, the microphone 120 can be connected to the positive terminal of the linear regulator 134 rather than the negative terminal as shown in FIG. 5, in which case the current source 302 would be connected to the negative terminal of the linear regulator 134 rather than the positive terminal.

Figure 6A:
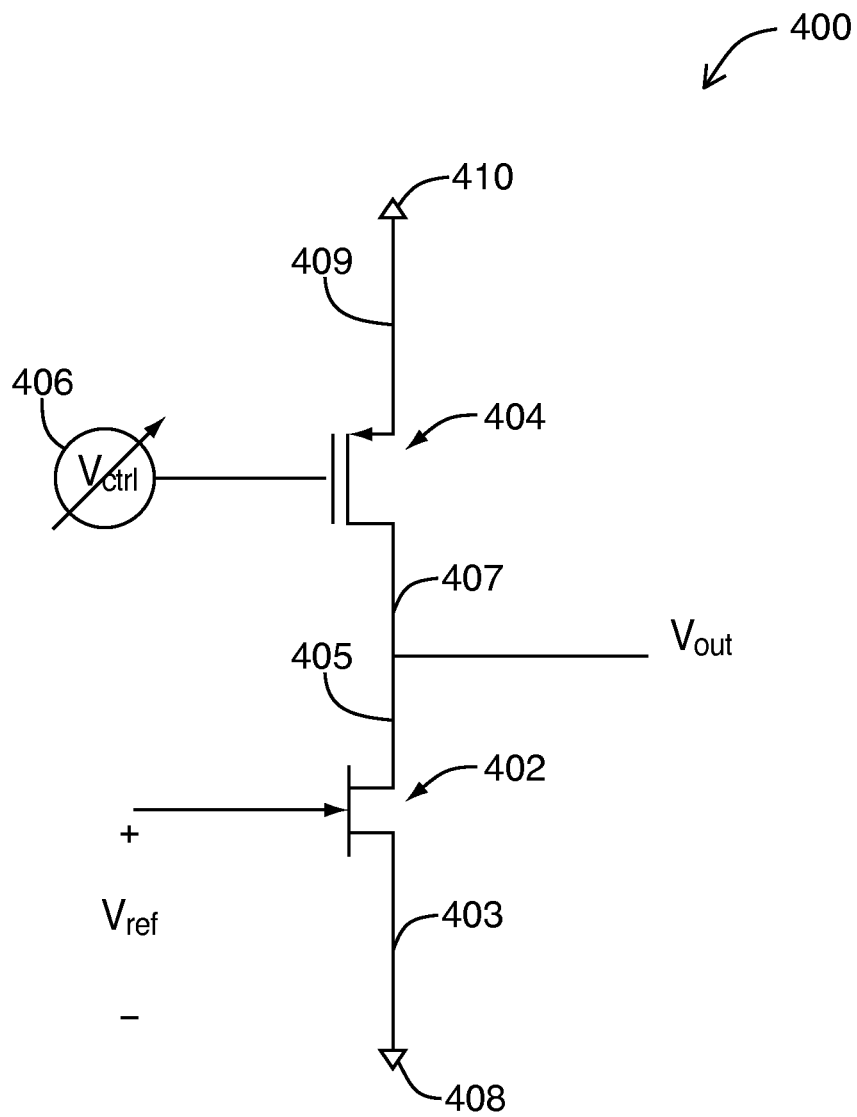
FIG. 6A is a simplified block diagram of a portion of the microphone system shown in FIG. 5.

Referring now to FIG. 6A, there is illustrated a circuit 400 that is simplified representation of a portion of the microphone system 300 in FIG. 5. The circuit 400 comprises transistors 402 and 404, which are JFET and PMOS transistors, respectively. Transistor 402 is driven by a fixed gate voltage $V_{ref}$ that provides sufficient drive voltage to form a channel for current to flow in the transistor 402, i.e. $V_{ref} > V_{th}$, the transistor threshold voltage. When implemented using JFET, the transistor 402 is intrinsically biased by the internal diode of the JFET and, therefore, the gate potential of transistor 402 will be close to zero Volts due to leakage current. A suitable JFET for use together with an electret microphone will therefore have a negative threshold voltage $V_{th}$.

The source 403 of transistor 402 is connected to a negative supply voltage terminal 408, such as ground, and the drain 405 of transistor 402 is connected to the drain 407 of transistor 404. The source 409 of transistor 404 is connected to a positive supply voltage terminal 410, such as the circuit supply voltage. A voltage source 406 provides a control voltage $V_{ctrl}$ to drive the transistor 404. The voltage source 406 is variable so that the control voltage $V_{ctrl}$ can be swept over a range of voltages. The output voltage $V_{out}$ of the circuit 400 is taken at the drains 405 and 407 shared in common by the transistors 402 and 404.

In the circuit 400, the transistor 402 operated at a fixed gate voltage $V_{ref}$ is used to represent the transistor within the intrinsic pre-amplifier 254 of microphone 120 (FIG. 5). Although in operation the gate voltage of the transistor will be modulated by the microphone signal 258, the intrinsic diode of the JFET establishes a dc bias level for the gate of the transistor. The microphone signal 258 is also normally relatively small compared to the dc bias level and, for moderate acoustic pressures, will not significantly change the bias point of the intrinsic pre-amplifier 254. Thus, the gate voltage of the transistor within the intrinsic pre-amplifier 254 can be approximated in the circuit 400 as a fixed reference voltage $V_{ref}$ as shown in FIG. 6A.

The transistor 404 is used to represent the current source 302 (FIG. 5) because the pre-amplifier bias current 262 supplied by the current source 302 is controllable using the current source control signal 310. Equivalently the current flowing through the transistor 404 can be controlled by varying the level of the control voltage $V_{ctrl}$ supplied to the gate of the transistor 404. As will be seen, in some example implementations, the current source 302 is implemented using one or more PMOS transistors configured as voltage-controlled current sources. As used herein, a voltage-controlled current source may be any circuit or combination of elements that collectively generates and supplies a current whose amplitude is essentially proportional to some voltage control signal. A bipolar PNP transistor could also be used for this type of operation and would normally result in the current source 302 having a larger transconductance.

Figure 6B:
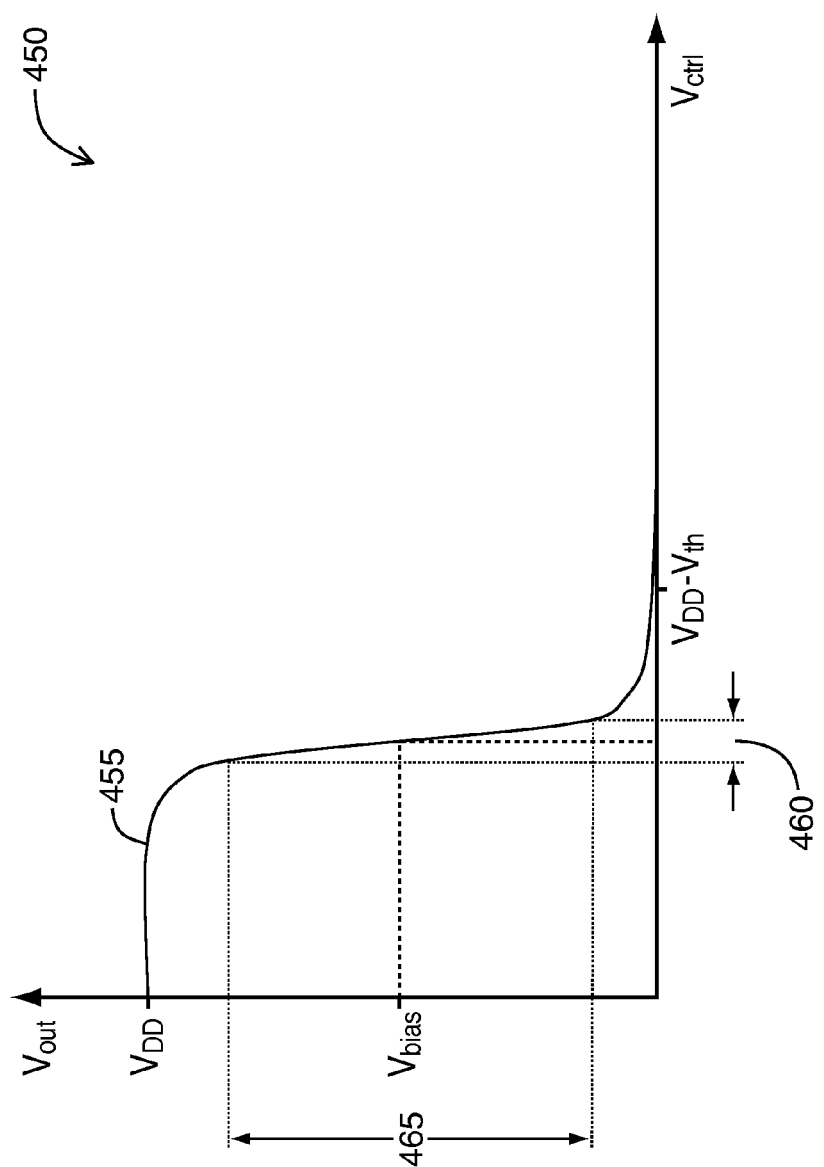
FIG. 6B is a graph showing a transfer characteristic of the simplified block diagram shown in FIG. 6A.

Referring now the FIG. 6B, the performance of the circuit 400 is explained in terms of the transfer characteristic between the control voltage $V_{ctrl}$ and the output voltage $V_{out}$. The graph 450 illustrated in FIG. 6B shows this transfer characteristic as curve 455. The x-axis on the graph 450 plots control voltage $V_{ctrl}$, while output voltage $V_{out}$ is plotted on the y-axis. As can be seen from curve 455, when the control voltage $V_{ctrl}$ is larger than about $V_{dd}-|V_{th}|$, where $V_{dd}$ represents the circuit supply voltage provided to the circuit 400 and $V_{th}$ represents the threshold voltage of the transistor 404, there is insufficient drive voltage to form a channel in the transistor 404. When this happens the transistor 404 is cut-off and consequently the transistor 402 pulls the output voltage $V_{out}$ down to ground.

On the other hand, when the control voltage $V_{ctrl}$ is much lower than $V_{dd}-|V_{th}|$, the source-gate voltage of the transistor 404 becomes large in comparison to the transistor threshold voltage $V_{th}$, which opens a large channel in the transistor 404 for current to flow. When this happens the transistor 404 is pushed deep into the triode region of operation. As the output impedance of the transistor 404 is reduced, the total voltage drop across the transistor 404 becomes small and the output voltage $V_{out}$ is pulled up toward the supply voltage $V_{dd}$.

However, for a narrow range 460 of the control voltage $V_{ctrl}$, each of the transistors 402 and 404 will operate in the saturation region. The narrow range 460 for which this is the case depends on the relative sizing of the transistors 402 and 404, but for balanced transistors will occur at approximately half of the supply voltage $V_{dd}$. Within the narrow range 460 of the control voltage $V_{ctrl}$, the output voltage $V_{out}$ is also controllable within a corresponding range 465 by varying the value of the control voltage $V_{ctrl}$.

For example, as shown in FIG. 6B, when $V_{ctrl}$ is equal to a set voltage $V_{set}$, the output voltage $V_{out}$ equals some pre-determined bias voltage $V_{bias}$. This pre-determined bias voltage $V_{bias}$ corresponds directly to the drain-source voltage of the transistor 402 and also sets a drain-source voltage for the transistor 404 in relation to the supply voltage $V_{dd}$. It can also be seen that the rate of change of the output voltage $V_{out}$ is very large within the range 465 and this is the range where a very power efficient gain may be obtained.

Assuming some voltage swing at the common drain point, which would be expected if the gate of transistor 402 is modulated by a small signal, such as a microphone signal 258 (FIG. 5), the bias points of the transistors 402 and 404 would be expected to fluctuate during operation. Thus, in order to ensure that transistor 402 remains in the saturation region, the pre-determined bias voltage $V_{bias}$ can be selected somewhere along curve 455 that provides adequate margin on both sides of the bias voltage $V_{bias}$ to accommodate positive and negative fluctuations from the acoustic sensor 252 due to acoustic pressures variations. Some extra margin on the top end may also be desirable to accommodate voltage regulation of the control voltage $V_{ctrl}$, as explained further below. In some practical implementations, it may be desirable to have at least 1 Volt over the JFET drain-source terminals. If possible, providing more than 1.80V of voltage over the JFET source-drain terminals may also be useful to obtain a high output impedance and thereby high gain as well. In addition to this, at least 300 mV extra margin should be left for regulation at the top side.

Figure 7:
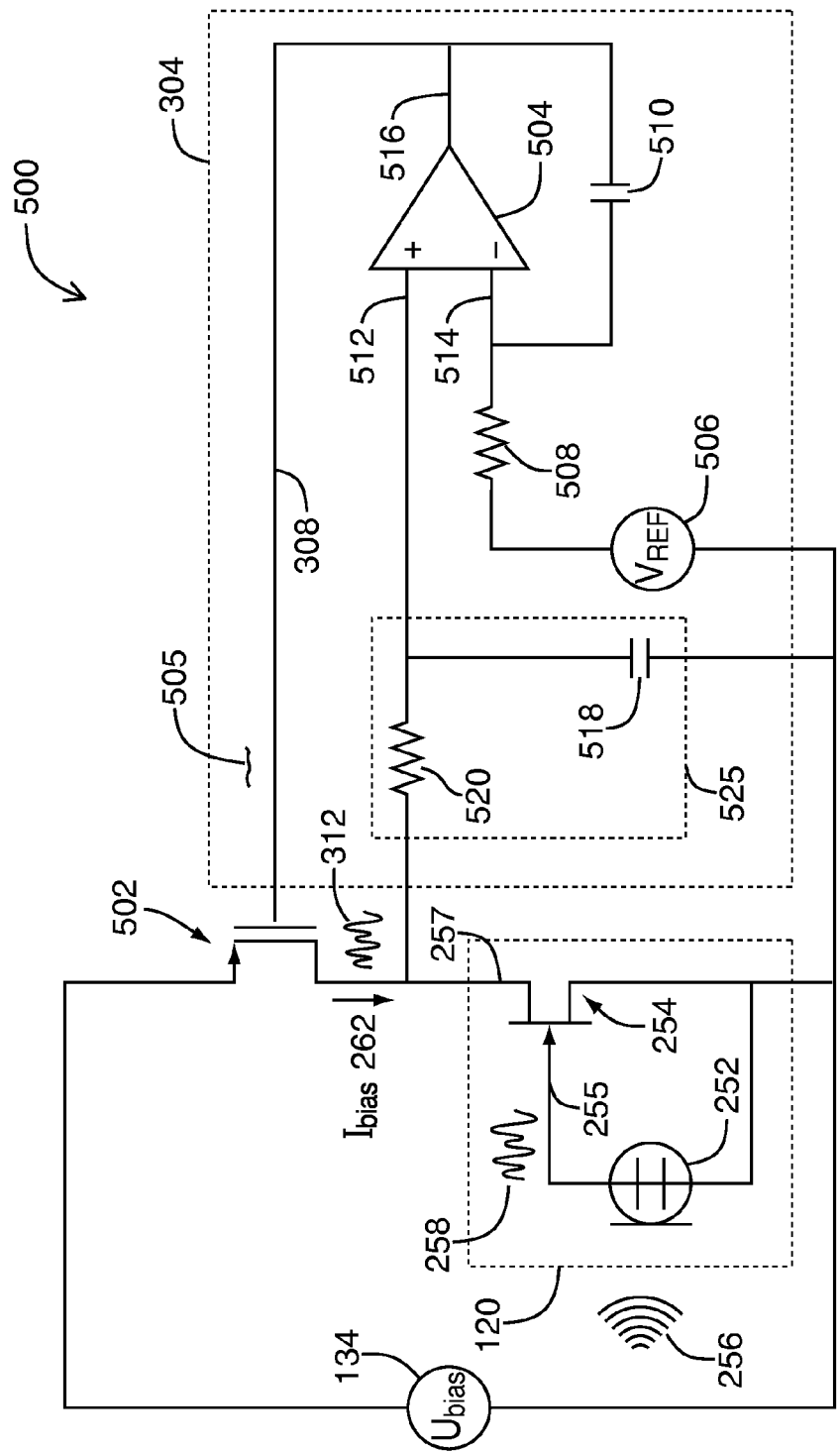
FIG. 7 is a block diagram of an example implementation of the microphone system shown in FIG. 5.

Referring now to FIG. 7, there is illustrated a microphone system 500 for a microphone, in accordance with the described embodiments. The microphone system 500 is similar to the microphone system 300 shown in FIG. 5, but with example implementations for the current source 302 and current source controller 304 shown explicitly. Accordingly, the microphone system 500 includes a microphone 120 coupled to a current source transistor 502, which is shown in FIG. 7 as a PMOS transistor. However, in alternative embodiments, the current source 302 may be implemented by a transistor of another type or, in some cases, by more than one current source transistors of the same or different types.

The gate of the current source transistor 502 is driven by a voltage control signal 505, which can be a regulation voltage generated the current source controller 304 based upon the output voltage 312 monitored at the output terminal 257 of the intrinsic pre-amplifier 254. In this way, the amplitude of the pre-amplifier bias current 262 supplied to the intrinsic pre-amplifier 254 is controlled by the current source controller 304 varying the amplitude of the regulation voltage, so that the transistor within the intrinsic pre-amplifier 254 operates in the saturation region at or near its pre-determined bias point. Because the amplitude of the pre-amplifier bias current 262 is controllable through the voltage control signal 505, the current source transistor 502 behaves like a voltage-controlled current source. While illustrated as a single PMOS transistor, other possible implementations of the current source 302 (FIG. 5) are possible.

The current source controller 304 shown in FIG. 7 is implemented using an op-amp 504 (also known as an "operational amplifier"), a reference voltage generator 506, a resistor 508 and a capacitor 510. The resistor 508 is connected between a negative input terminal 514 of the op-amp 504 and a positive terminal of the reference voltage generator 506. The negative terminal of the reference voltage generator 506 is connected to a negative terminal of the linear regulator 134. By way of the resistor 508, the reference voltage generator 506 provides a reference voltage (e.g, $V_{REF}$) to the negative input terminal 514 of the op-amp 504. An output terminal 516 of the op-amp 504 (sometimes referred to as an "op-amp output terminal") is connected to the gate of the current source transistor 502 to close the feedback loop 308 and provide the gate of the current source transistor 502 with the voltage control signal 505, which in this case is a regulation gate voltage of the current source transistor 502. The capacitor 510 is connected across the op-amp 504 between the output terminal 516 and the negative input terminal 514.

As illustrated in FIG. 7, the output terminal 257 of the intrinsic pre-amplifier 254 is connected to the positive input terminal 512 of the op-amp 504 through a lowpass filter 525 formed using the filter resistor 520 and the filter capacitor 518. In this configuration, the positive input terminal 512 of the op-amp 504 (as opposed to the negative input terminal 514) may be used in the feedback loop 308 to account for the fact that the current source transistor 502 provides a 180 degree phase inversion when implemented using a PMOS. Effectively, the microphone bias point behaves as a regulated reference point, while the negative input terminal 514 is used to integrate the difference between the microphone bias point and the reference voltage $V_{REF}$ set by the reference voltage generator 506. The lowpass filter 525 may be used to reduce the effect of signal changes in the feedback loop 308 (which may include the op-amp 504, reference voltage generator 506, resistor 508, and capacitor 510 in addition to the lowpass filter 525).

When the microphone system 500 is operational, the feedback loop 308 regulates the dc bias component of the output voltage 312 (i.e., not including pre-amplified microphone signal 316 shown in FIG. 5) to the reference voltage $V_{REF}$. Accordingly, the pre-determined bias point for the intrinsic pre-amplifier 254 may be controlled according to the specified output level of the reference voltage generator 506. While the reference voltage generator 506 is illustrated as a discrete voltage source, in some example configurations, the reference voltage generator 506 may be synthesized instead from the linear regulator 134 combined with a suitable voltage divider or voltage regulator circuit.

In some embodiments, the lowpass filter 525 may be replaced with a switch capacitor filter that may be implemented using filter capacitor 518 in parallel with a second capacitor (not shown) that is smaller than filter capacitor 518 in comparison. During operation of the switch capacitor filter, filter capacitor 518 may be charged by switching the second capacitor successively between the output terminal 257 and the filter capacitor 518 under the control of a high frequency oscillator (not shown).

In some cases, the pre-determined bias point can set at about 60% of the supply voltage level of the linear regulator 134. This transistor bias point provides margin at the top end for performing voltage regulation of the current source transistor 502 by way of the voltage control signal 505. However, at this level, margin is also provided at the bottom end to keep the transistor within the intrinsic pre-amplifier 254 operating in the saturation region in the presence of voltage swing at the output terminal 257.

As shown in FIG. 7, the current source controller 304 may be implemented using the combination of the op-amp 504, resistor 508 and capacitor 510. In this configuration, the current source controller 304 may functionally implement an integrator configured to integrate an error signal generated by an error signal generator. For example, the op-amp 504 functions like an error signal generator by internally generating an error signal based on the differential input to the op-amp 504. In the particular configuration shown in FIG. 7, the op-amp 504 internally generates an error signal equal to the difference between the output voltage 312, which is applied to the positive input terminal 512 by way of the lowpass filter 525, and the reference voltage supplied by the reference voltage generator 506 to the negative input terminal 514.

However, with the resistor 508 and capacitor 510 connected in a negative feedback loop, the op-amp 504 also functions like an integrator having an integration time constant equal to the product of the resistance R and the capacitance C of the RC network. Equivalently, the RC network has a first-order pole equal to the inverse of the integration time constant and which denotes the integration frequency of the integrator. The error signal generated internally to the op-amp 504 (in this case representing a difference between the output voltage 312 and reference voltage supplied by the reference voltage generator 506) is integrated and used as the voltage control signal 505 for regulating the current source transistor 502.

The rate at which the error signal is integrated depends on the integration time constant of the RC network. A larger integration time constant can be selected to achieve slower integration speeds and thereby make the feedback loop 308 generally less responsive. On the other hand, faster integration speeds and a correspondingly more aggressive control can be achieved by selecting a smaller integration time constant. The integration time constant is variable by selecting the size of the resistor 508 and the capacitor 510, as well be appreciated.

In order to pass audio signals without distortion, the feedback loop 308 should have a time constant larger than or equivalent to the time constant of the lowest frequency signals of interest in the pre-amplified microphone signal 316 (shown in FIG. 5). Equivalently, the integrator may have an integration frequency below a frequency range of the pre-amplified microphone signal 316. Limiting the speed of the integrator in relation to the frequency content of the pre-amplified microphone signal 316 helps to suppress noise and other high-frequency distortion within the voltage control signal 505. The intrinsic pre-amplifier 254 is thereby more effectively stabilized at the pre-determined bias point.

While FIG. 7 illustrates one possible implementation of the current source controller 304, other implementations of the current source controller 304 to include an error signal generator and an integrator are possible as well.

Intuitively, operation of the current source controller 304 may be understood in the following way. Assume the output voltage 312 to be lower than the desired voltage, that the voltage at the negative input terminal 514 represents the pre-determined bias point of the intrinsic pre-amplifier 254, and that the output of the op-amp 504 is high so that current source transistor 502 is off. In this case, the negative input terminal 514 of the op-amp will be higher than the positive input terminal 512, with the result that the op-amp 504 will begin to reduce its output voltage. At a certain point, the output voltage 312 provided to the positive input terminal 512 will essentially match the reference voltage provided to the negative input terminal 514. At this point, continued operation of the current source controller 304 will attempt to maintain the output voltage 312 at its regulated level. The capacitor 510 will ensure the action is not instantaneous and, together with resistor 508, will set the RC time constant of the feedback loop 308. As mentioned above, this particular configuration may works as a negative feedback system, even though the positive input terminal 512 of the op-amp 504 is driven by the output voltage 312, due to the 180 degree phase inversion provided by the current source transistor 502.

The pre-amplified microphone signal 316 (shown in FIG. 5) contributes a component of the output voltage 312 sensed by the current source controller 304 (the other principal component being the dc bias voltage of the intrinsic pre-amplifier 254). Therefore, the integration time constant should be slow enough that the feedback loop 308 substantially suppresses the pre-amplified microphone signal 316 and regulates only the dc component of the output voltage 312 (representing the dc bias voltage of the intrinsic pre-amplifier 254). This can be accomplished by placing the first-order pole of the RC network at or just below the lower end of the frequency bandwidth of the pre-amplified microphone signal 316. If the pre-amplified microphone signal 316 represents an audio signal in the audible range (i.e., 20 Hz to 20 kHz), the first-order pole may be located at 20 Hz or less. With a response time generally too slow to track the pre-amplified microphone signal 316, the integrator thereby stabilizes the intrinsic pre-amplifier 254 at its pre-determined bias point. However, other time constants could be appropriate as well depending on the application or the frequency content of the pre-amplified microphone signal 316.

The current source transistor 502 is shown in FIG. 7 implemented using a PMOS transistor, which tends to have lower 1/f noise than a corresponding NMOS transistor of similar or equivalent dimensions. In an alternative configuration, the current source transistor 502 can be replaced with multiple PMOS transistors connected in parallel. The comparatively less noisy performance of the PMOS transistor may be beneficial due to the sensitivity of the feedback loop 308 to noise and other frequency content. However, in variant embodiments, the current source transistor 502 may be replaced by one or more transistors of one or more different types, included NMOS transistors or bipolar junction transistors.

Figure 8:
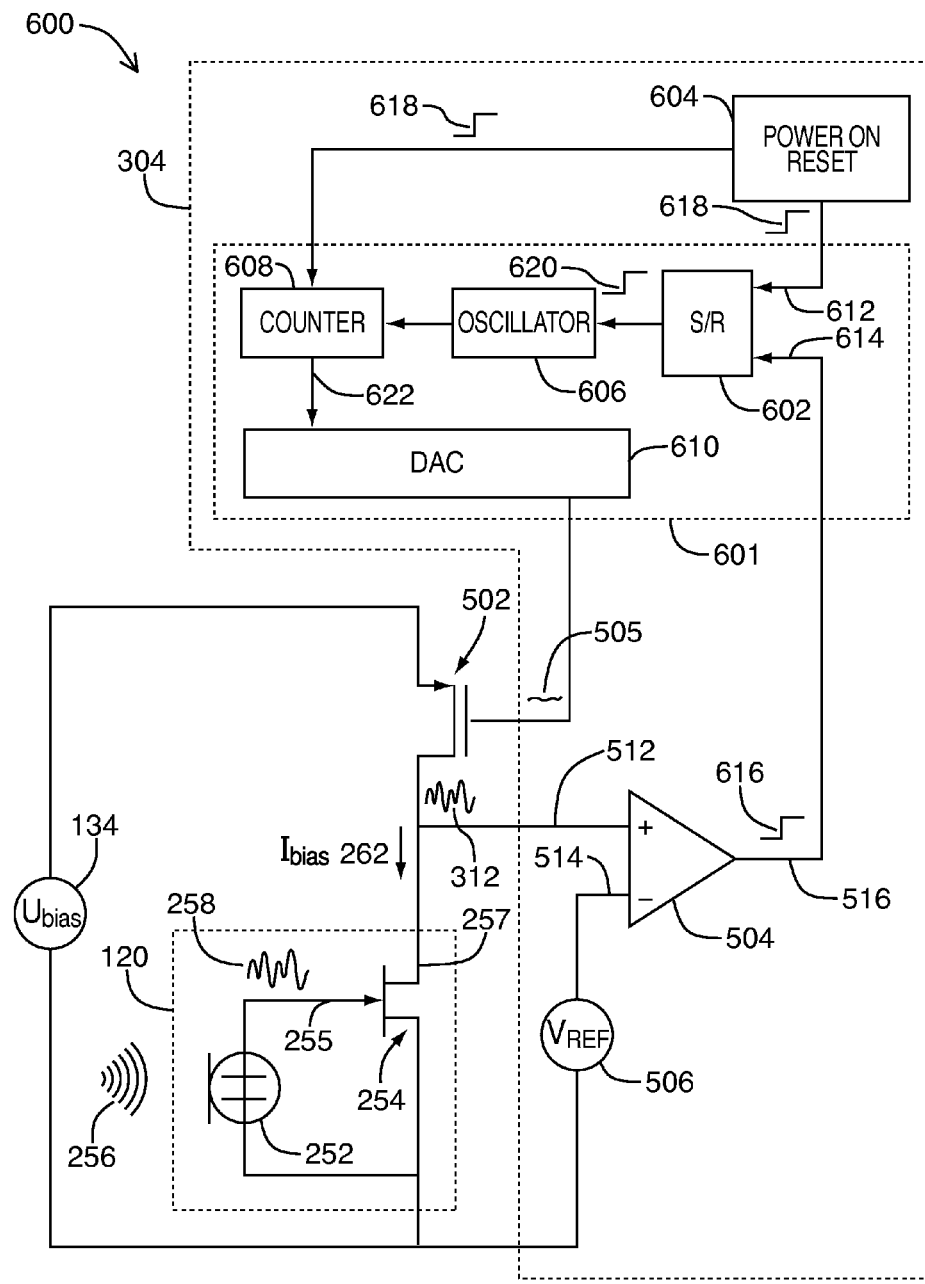
FIG. 8 is a block diagram of another example implementation of the microphone system shown in FIG. 5.

Referring now to FIG. 8, the current source controller 304 may alternatively be implemented in pseudo-open loop configuration. This alternative configuration is referred to as "pseudo-open loop" because the current source controller 304 uses the voltage control signal 505 as a set point voltage to fix the bias point of the intrinsic pre-amplifier 254 to the pre-determined level. However, after setting the intrinsic pre-amplifier 254 to the pre-determined bias point, the current source controller in some embodiments does not thereafter actively regulate the bias point of the intrinsic pre-amplifier 254. In some embodiments, the current source controller 304 sets the bias point of the intrinsic pre-amplifier 254 once, for example, at start up of the mobile device 100 (FIG. 1) or after the mobile device 100 exits a low power or standby mode. However, as will be explained further below, in other embodiments, the current source controller 304 is configured so that a new set point voltage may occasionally be determined for the voltage control signal 505 at various different times after the mobile device 100 has been turned on and has been operating. In any of these cases, the current source controller 304 still uses some initial feedback to determine the voltage control signal 505. Another example may be that the correct bias point of the microphone is determined after the mobile device 100 is activated and goes out of low power standby mode.

The current source controller 304 shown in FIG. 8 includes op-amp 504, reference voltage generator 506, a variable voltage supply 601 and a power on reset 604. The reference voltage generator 506 provides a reference voltage (e.g., $V_{REF}$) to the negative input terminal 514 of op-amp 504, which again has a variable magnitude that sets the pre-determined bias point of the intrinsic pre-amplifier 254. The positive input terminal 512 of the op-amp 504 is connected to the output terminal 257 for sensing the magnitude of the output voltage 312 as an input to the feedback loop 308. In this configuration, the op-amp 504 is operated open-loop and functions like a comparator. As will be appreciated, open-loop operation of the op-amp 504 may imply that there is no direct feedback between the output terminal 516 of the op-amp 504 and either of the positive input terminal 512 and the negative input terminal 514.

The op-amp 504 generates and outputs a sweep disable signal 616 based upon the polarity of the differential input to the op-amp 504. If the sensed value of the output voltage 312 is above the pre-determined bias point as set by the reference voltage generator 506, the differential input to the op-amp 504 will be positive and the op-amp 504 will therefore output a high voltage (i.e. a digital "1"). On the other hand, if the sensed value of the output voltage 312 is below the pre-determined bias point of the intrinsic pre-amplifier 254, the differential input to the op-amp 504 will be negative and the op-amp 504 will correspondingly output a low voltage (i.e. a digital "0"). Depending on its signal level, high or low, the sweep disable signal 616 indicates the relative magnitudes of the output voltage 312 and the pre-determined bias point in order to enable or disable the variable voltage supply 601. Accordingly, the op-amp 504 is an example of a feedback sensor used by the variable voltage supply 601 for comparing the magnitude of the output voltage 312 to the pre-determined bias point of the intrinsic pre-amplifier 254.

When the mobile device 100 is powered on or switched out of a dormant mode, the power on reset 604 detects the change in operation of the mobile device 100 and causes the variable voltage supply 601 to initiate a sweep of the output voltage 312 over a range of voltages. The variable voltage supply 601 also monitors the magnitude of the output voltage 312 in relation to the pre-determined bias point of the intrinsic pre-amplifier 254 using the sweep disable signal 616. When the output voltage 312 achieves the pre-determined bias point, the sweep disable signal 616 experiences a transition between signal levels (e.g. from low to high) causing the variable voltage supply 601 to hold its output at the current level. The variable voltage supply 601 is thereafter disabled until a subsequent sweep of the output voltage 312 is requested by the power on reset 604. Instead of the power on reset 604, some other sweep sequencer can be used to control operation of the variable voltage supply 601.

When the mobile device 100 has just been turned on and the microphone 120 is not yet sensing sound, the output voltage 312 may only have a component substantially contributed by the dc bias voltage of the intrinsic pre-amplifier 254. The pre-amplified microphone signal 316 will tend to be small. Accordingly, sweeping the output voltage 312 across a range of voltages may be equivalent to sweeping the dc bias voltage of the intrinsic pre-amplifier 254 directly. If the pre-amplified microphone signal 316 is present at the output terminal 257 during a given voltage sweep, the instantaneous additional voltage swing due to the pre-amplified microphone signal 316 could prematurely trigger a level transition in the sweep disable signal 616 and end that voltage sweep prematurely.

In some embodiments, the variable voltage supply 601 can sweep the output voltage 312 only once upon power on of the mobile device 100 to ensure that the output voltage 312 consists essentially of its dc bias component only through the sweep. However, in alternative embodiments, the variable voltage supply 601 can also sweep the output voltage 312 periodically after the mobile device 100 has been turned out, provided the microphone 120 is disabled so the output voltage 312 sensed by the feedback sensor and compared against the pre-determined bias point again reflects only a dc bias voltage of the intrinsic pre-amplifier 254.

As seen in FIG. 8, the variable voltage supply 601 is implemented using a Set/Reset (S/R) latch 602, an oscillator 606, a digital counter 608 and a digital to analog converter (DAC) 610. To implement a sweep of the output voltage 312, the output terminal 516 of the op-amp 504 is connected to a reset input 614 of the S/R latch 602, which thereby receives the sweep disable signal 616. The power on reset 604 also generates a sweep initiate signal 618 to indicate that power on of the mobile device has been detected, in which case the variable voltage supply 601 should commence a voltage sweep. The power on reset 604 is connected to a set input 612 of the S/R latch 602 to provide the sweep initiate signal 618.

The S/R latch 602 generates and outputs an oscillator enable signal 620, which is determined based upon the values of the sweep disable signal 616 and the sweep initiate signal 618. For example, the S/R latch 602 outputs a high digital value whenever the set input 612 is asserted (i.e. the sweep initiate signal 618 transistors to a high digital value) and a low digital value whenever the reset input 614 is asserted (i.e. the sweep disable signal 616 transitions to a high digital value). The oscillator enable signal 620 is supplied to the oscillator 606 for enabling and disabling the oscillator 606 depending on the value of the oscillator enable signal 620.

When enabled by the S/R latch 602, the oscillator 606 generates a stable clock signal used to drive the digital counter 608, which begins to decrement (or alternatively increment) a digital count value 622 from some initial value at a rate set by the clock frequency of the oscillator 606. The digital counter 608 may count each cycle of the oscillator 606 or some multiple thereof in order to control the rate at which the digital counter 608 is decremented (or incremented). The sweep initiate signal 618 is also provided to the digital counter 608 to reset the digital count value 622 to the initial value before the start of each voltage sweep. Depending on whether the digital counter 608 is configured to increment or decrement the digital count value 622, the initial value may be either a low value or a high value, respectively.

Digital to analog converter 610 is coupled to the digital counter 608 and generates the voltage control signal 505 for the current source transistor 502 by converting the digital count value 622 into an analog signal. As the digital counter 608 decrements or increments the digital count value 622 in response to the oscillator 606, the voltage control signal 505 is also swept across a corresponding range of set voltages beginning from an initial set voltage depending on the initial value of the digital count value 622. Sweeping the voltage control signal 505 varies the effective drive (i.e., source-gate) voltage of the current source transistor 502. Because effective drive voltage of the current source transistor 502 controls the amplitude of the pre-amplifier bias current 262, sweeping the voltage control signal 505 varies the pre-amplifier bias current 262 across a range of currents. As the amplitude of the pre-amplifier bias current 262 is varied, the effective voltage drop across the current source transistor 502 is also varied correspondingly. In this way, the variable voltage supply 601 is able to indirectly sweep the output voltage 312 across a range of voltages.

In one configuration of the variable voltage supply 601, the digital count value 622 is initially set to a high value, which may correspond to a maximum control voltage for the current source transistor 502 at which the current source transistor 502 is turned off and not conducting current. For example, the digital count value 622 may be initialized to the nominal voltage supply level of the linear regulator 134. At that level, the current source transistor 502 will have insufficient drive voltage and, therefore, will initially be cut-off, causing the intrinsic pre-amplifier 254 to pull the output voltage 312 to ground. With a negative differential input, the op-amp 504 will output a low value and the variable voltage supply 601 will initially be disabled. When the sweep initiate signal 618 is received and the variable voltage supply 601 is enabled, the digital counter 608 will begin to decrement the digital count value 622. As the voltage control signal 505 is correspondingly decreased, the current source transistor 502 eventually turns on and begins to conduct, and the output voltage 312 starts to increase toward the pre-determined bias point.

For some value of the voltage control signal 505 (e.g., the set point voltage), the output voltage 312 will equal and then incrementally surpass the pre-determined bias point of the intrinsic pre-amplifier 254. At or near that instant, the differential input to the op-amp 504 becomes positive and the sweep disable signal 616 transitions to a high value. The transition is detected by the variable voltage supply 601 when the reset input 614 of the S/R latch 602 is asserted and the S/R latch 602 thereby switches off the oscillator 606. When the oscillator 606 is disabled, the digital counter 608 also holds the digital count value 622 at some final value at or near to which the sweep disable signal 616 transitioned. When the digital count value 622 is thereby held constant, the voltage control signal 505 is also held at some final set voltage at which the output voltage 312 approximately equals the pre-determined bias point.

Depending on the speed of digital counter 608, some overshoot of the output voltage 312 may occur. However, this can be addressed by slowing the count rate of the digital counter 608, for example by slowing the clock frequency of the oscillator 606. With the output voltage 312 held at approximately the level of the reference voltage generator 506, the intrinsic pre-amplifier 254 has a dc bias voltage approximately equal to the pre-determined bias point. So long as the voltage supply level of the linear regulator 134 remains approximately constant, the intrinsic pre-amplifier 254 will remain operating at the pre-determined bias point until a further voltage sweep is performed.

As will be appreciated, some modification to the configuration in FIG. 8 may be made in variant embodiments. For example, the positive input terminal 512 and the negative input terminal 514. In that case, however, the control logic implemented by the variable voltage supply 601 may also be varied to reflect the different polarity of the sweep disable signal 616, such as reconfiguring the S/R latch 602.

In another case, the initial value for the digital count value 622 may be a small (rather than large) value so that the current source transistor 502 is initially supplied with a very large effective drive voltage. For example, the initial value may be zero. Accordingly, when the power on reset 604 commences voltage sweep, the current source transistor 502 is driven deep into the triode region and the output voltage 312 is pulled up to approximately the voltage supply level of the linear regulator 134. The differential input to the op-amp 504 will therefore initially be positive. However, as the digital count value 622 is incremented and the effective drive voltage of the current source transistor 502 is reduced, the output voltage 312 will gradually decrease. For some level of the voltage control signal 505 (i.e. the set point voltage), the output voltage 312 will reach and then drop incrementally below the pre-determined bias point. As before, when the level transition of the sweep disable signal 616 is detected, the variable voltage supply 601 is disabled from further sweeping, the digital count value 622 is held at the final value, and the voltage control signal 505 is thereby also held constant at some final set voltage.

Figure 9:
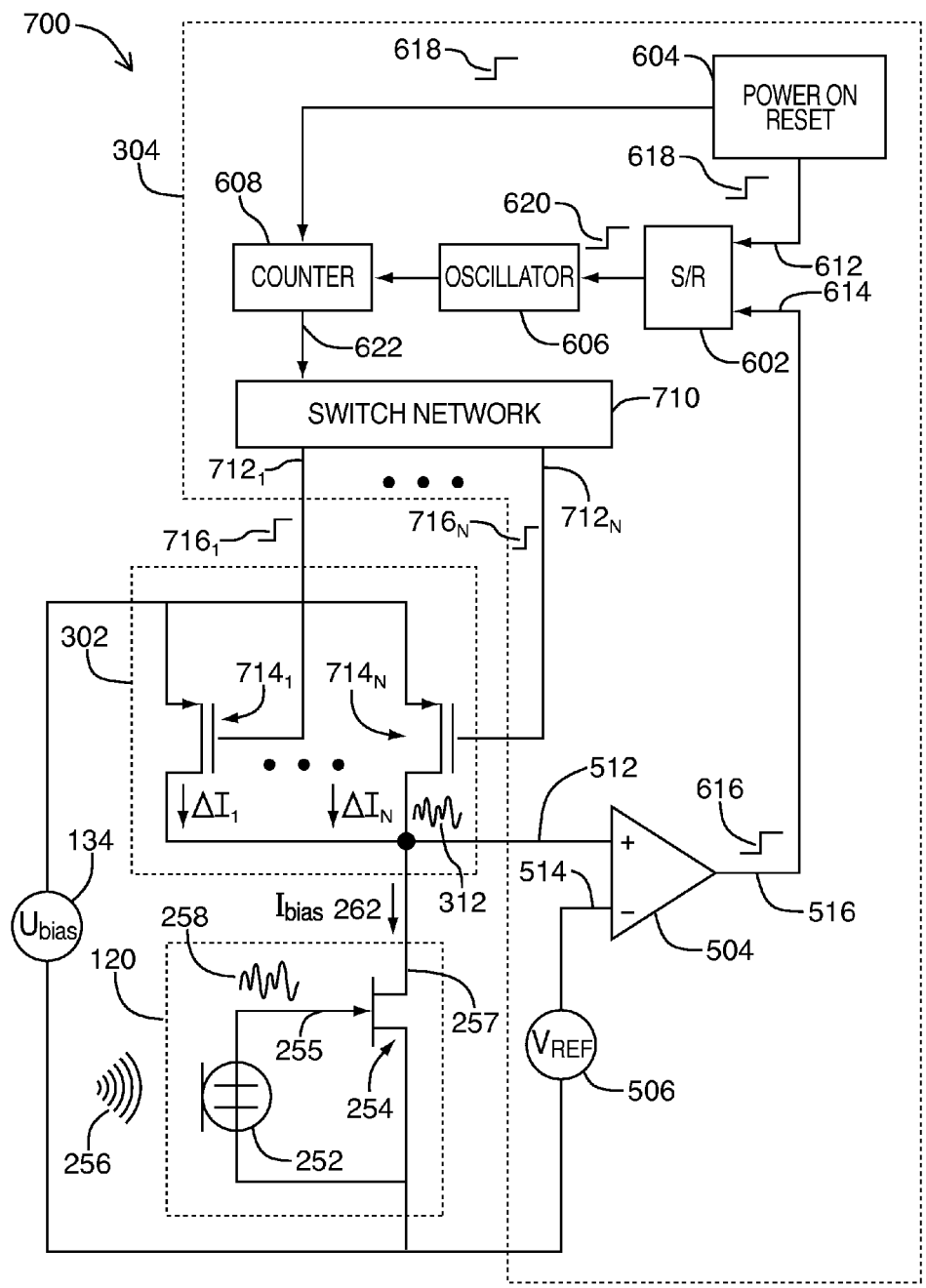
FIG. 9 is a block diagram of another example implementation of the microphone system shown in FIG. 5.

Referring now to FIG. 9, there is illustrated an alternative configuration of the current source controller 304 to the configuration shown in FIG. 8. As before, an op-amp 504 is used as a feedback sensor to generate the sweep disable signal 616 by comparing the output voltage 312 at the output terminal 257 with the pre-determined bias point of the intrinsic pre-amplifier 254, with the digital value of the sweep disable signal 616 indicating the relative magnitudes of each. To generate the sweep disable signal 616, the positive input terminal 512 of the op-amp 504 is connected to the output terminal 257, while the negative input terminal 514 is supplied from the reference voltage generator 506 with the reference voltage (e.g., $V_{REF}$) that sets the pre-determined bias point.

However, in this alternative configuration, the voltage control signal 505 is not swept in order to vary the amplitude of the pre-amplifier bias current 262 (as in the configuration of the current source controller 304 presented in FIG. 8). Instead the pre-amplifier bias current 262 is directly swept across a range of currents using multiple voltage-controlled current sources in the current source 302 that are parallel-connected and independently controllable by the current source controller 304. Each voltage-controlled current source may output approximately the same incremental current, so that the pre-amplifier bias current 262 may be varied in discrete and approximately equal steps based on the number of voltage-controlled current sources that are turned on at any given moment. In this way, the pre-amplifier bias current 262 may be swept directly across a discrete range of currents.

Accordingly, in some embodiments, the current source controller 304 is implemented using S/R latch 602, power on reset 604, oscillator 606, digital counter 608 and switch network 710 to incrementally sweep the pre-amplifier bias current 262 over a discrete range of currents until the intrinsic pre-amplifier 254 is set to the pre-determined bias point. The reset input 614 of the S/R latch 602 again receives the sweep disable signal 616 generated by the op-amp 504, while the set input 612 again receives the sweep initiate signal 618 provided by the power on reset 604, which again functions like a sweep sequencer for controlling when sweeps are initiated. In response to the sweep disable signal 616 and the sweep initiate signal 618, the S/R latch 602 enables and disables the oscillator 606 to activate the digital counter 608.

In the configuration shown in FIG. 9, switch network 710 replaces digital to analog converter 610 (FIG. 8) and is connected to the output of the digital counter 608 to receive the digital count value 622. Switch network 710 has N outputs $712_{1-N}$ connected respectively to N current source transistors $714_{1-N}$ in the current source 302, and provides switch control signals $716_{1-N}$ individually and independently used to control the current source transistors $714_{1-N}$ between different levels including an on level (in which the current source transistors $714_{1-N}$ are conducting) and an off level (in which the current source transistors $714_{1-N}$ are non-conducting). It should be appreciated that the switch control signals $716_{1-N}$, although explicitly presented as separate signals, may in some cases be grouped together into a multi-dimensional signal vector that provides a single current source control signal (e.g., 310 in FIG. 5) for the current source 302.

The switch network 710 is configured to generate the switch control signals $716_{1-N}$ individually and independently and varying between the on and off levels. At the off level, each of the current source transistors $714_{1-N}$ corresponding to a given one of the switch control signals $716_{1-N}$ would be provided with insufficient drive voltage to form a channel for current to flow and is consequently cut-off. Current flow through that corresponding current source transistor $714_{1-N}$ will be negligible when a respective current source transistor $714_{1-N}$ is in the off state. For example, the off signal level of the switch control signals $716_{1-N}$ can be the nominal supply voltage of the linear regulator 134.

The on level of the switch control signals $716_{1-N}$ is selected so that the corresponding current source transistor $714_{1-N}$ starts conducting current. When conducting, a respective current source transistor $714_{1-N}$ will behave like a voltage-controlled current source and conduct an incremental bias current $\Delta I_{1-N}$ that may be controlled pre-dominantly by the effective drive voltage supplied to that current source transistor $714_{1-N}$. Accordingly, the current source transistors $714_{1-N}$ represent one possible implementation of a plurality of voltage-controlled current sources. In some embodiments, the switch network 710 can include one or more digital to analog converters (not shown) to output the switch control signals $716_{1-N}$ as analog signals.

The current source transistors $714_{1-N}$ are parallel-connected between the switch network 710 and the microphone 120 such that the current source transistors $714_{1-N}$ have a common drain at the output terminal 257 of the intrinsic pre-amplifier 254. Therefore, the incremental bias currents $\Delta I_{1-N}$ are summed together at the common drain of the current source transistors $714_{1-N}$ to generate the pre-amplifier bias current 262 for the intrinsic pre-amplifier 254 incrementally depending on how many of the current source transistors $714_{1-N}$ are turned on and conducting.

The amplitude of the pre-amplifier bias current 262 is therefore controllable by varying the number of incremental bias currents $\Delta I_{1-N}$ that are summed together at the common drain. If each current source transistor $714_{1-N}$ conducts the same incremental bias current, the total magnitude of the pre-amplifier bias current 262 will be proportional to the number of the current source transistors $714_{1-N}$ that are conducting. However, in some alternative embodiments, some of the current source transistors $714_{1-N}$ may be sized differently to provide incremental bias currents $\Delta I_{1-N}$ of different magnitudes. For example, some of the current source transistors $714_{1-N}$ may be sized smaller to provide fine control over the amplitude of the pre-amplifier bias current 262.

For a typical microphone, an increase of 3 uA in the saturation region will result in approximately a 100 mV increase in bias voltage, which is also equivalent to an output impedance of about 30 k$\Omega$. Accordingly, the pre-amplifier bias current 262 may be increased in small increments, such as 3 uA or smaller, for operation of the intrinsic pre-amplifier 254 close to the pre-determined bias point. If larger current increments are used to sweep the pre-amplifier bias current 262, excessive overshoot may occur causing the intrinsic pre-amplifier 254 to operate further away from the pre-determined bias point than intended.

In operation, each current source transistor $714_{1-N}$ is initially in cut-off mode and not conducting, which pulls the output voltage 312 down to ground. When the digital counter 608 receives the sweep initiate signal 618 from the power on reset 604 and begins to increment (or decrement), the switch network 710 begins to turn on the current source transistors $714_{1-N}$ sequentially, one at a time, by setting the corresponding switch control signals $716_{1-N}$ to the on level. The switch network 710 determines the rate at which the current source transistors $714_{1-N}$ are turned on in relation to the count rate of the digital counter 608. For example, the switch network 710 can up or down sample the digital count value 622 as required to set a suitable sweep rate. Of course, suitable sweep rates can be achieved by other configurations as well, such as digital counter 608 slowing the clock frequency of the oscillator 606.

As the amplitude of the pre-amplifier bias current 262 is increased with each incremental current added at the rate set by the switch network 710, the voltage drop across the intrinsic pre-amplifier 254 starts to increase, pulling the output voltage 312 up toward the supply voltage level of the linear regulator 134. When a sufficient number of the current source transistors $714_{1-N}$ are turned on, the output voltage 312 will be pulled up to and incrementally above the level of the reference voltage generator 506, which causes a polarity reversal in the differential input of the op-amp 504. As described above, at that instant the sweep disable signal 616 transitions to a high digital value and asserts the reset input 614 of the S/R latch 602, stopping the digital count value 622 at some final value. The switch network 710 is also correspondingly disabled, and the pre-amplifier bias current 262 is then held constant at its final level at which the intrinsic pre-amplifier 254 operates substantially at the pre-determined bias point.

The current source controller 304 otherwise functions as described above with reference to FIG. 8 and, for convenience, will not be described further.

Figure 10:
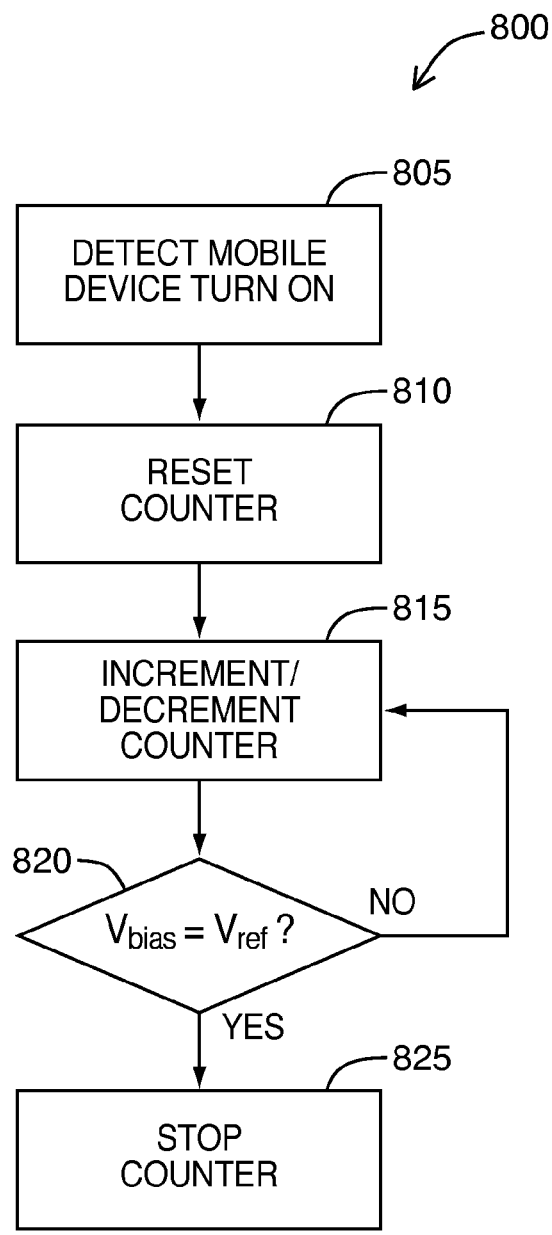
FIG. 10 is a flow diagram of a method of operating the example implementations shown in FIGS. 8 and 9.

Referring now to FIG. 10, there is illustrated a method 800 that can be performed by the current source controller 304 as illustrated in FIG. 8 or FIG. 9 to set the intrinsic pre-amplifier 254 for operation at the pre-determined bias point. The acts illustrated in FIG. 10 are illustrative only and can be modified in various alternative embodiments. For example, some acts may be added, omitted or modified to those specifically described below. Further description of method 800 may be found above with reference to FIGS. 8 and 9.

At 805, a sweep sequence module detects turning on of the mobile device 100. However, in some alternative embodiments, other or additional events can be detected at 805 by the sweep sequence module. For example, a change in mode of operation of the mobile device 100, such as waking up from a sleep mode, or passage of a prescribed time interval since the previous time at which method 800 was performed may be detected instead.

At 810, after mobile device turn on or some other event has been detected at 805, a digital count value (e.g., 622 in FIGS. 8 and 9) is reset to an initial value, which can be a high digital value or a low digital value in different embodiments. At 815, the initialized digital count value is incremented or decremented. The digital count value is translated into a control signal for a current source controller (e.g., 304 in FIGS. 8 and 9), which can be a voltage control signal or individual switch control signals in some cases.

At 820, an operating characteristic of a microphone transistor (e.g., 254 in FIGS. 8 and 9) is monitored and compared against a pre-determined bias point of the microphone transistor, which may have a value at which the microphone transistor is known to operate in the saturation region. If the microphone transistor is a JFET, operating sufficiently far into the saturation region (e.g. above 1.80 Volt) may tend to ensure correct operation of the microphone transistor. However, the current output from the microphone transistor may vary widely for individual microphones (e.g. 150-350 µA) due to production variation, type and environment. To set the microphone transistor at the pre-determined bias point, for example, a dc bias voltage of the microphone transistor can be monitored and compared against a reference voltage level that corresponds to the pre-determined bias point. If it is determined that the monitored operating characteristic is below or alternatively above the pre-determined bias point, depending on whether the digital counter is incremented or decremented, 820 branches back to 815 and the digital counter is further incremented or decremented.

However, if it is determined at some point that the operating characteristic equals the pre-determined bias point, then 820 branches to 825 and the digital counter is stopped at some final value. Thereby the operating characteristic of the microphone transistor is set approximately equal to the pre-determined bias point. The method 800 can thereafter be repeated in order to reset the operating characteristic of the microphone transistor to the pre-determined bias point some time thereafter if desired.

Figure 11A:
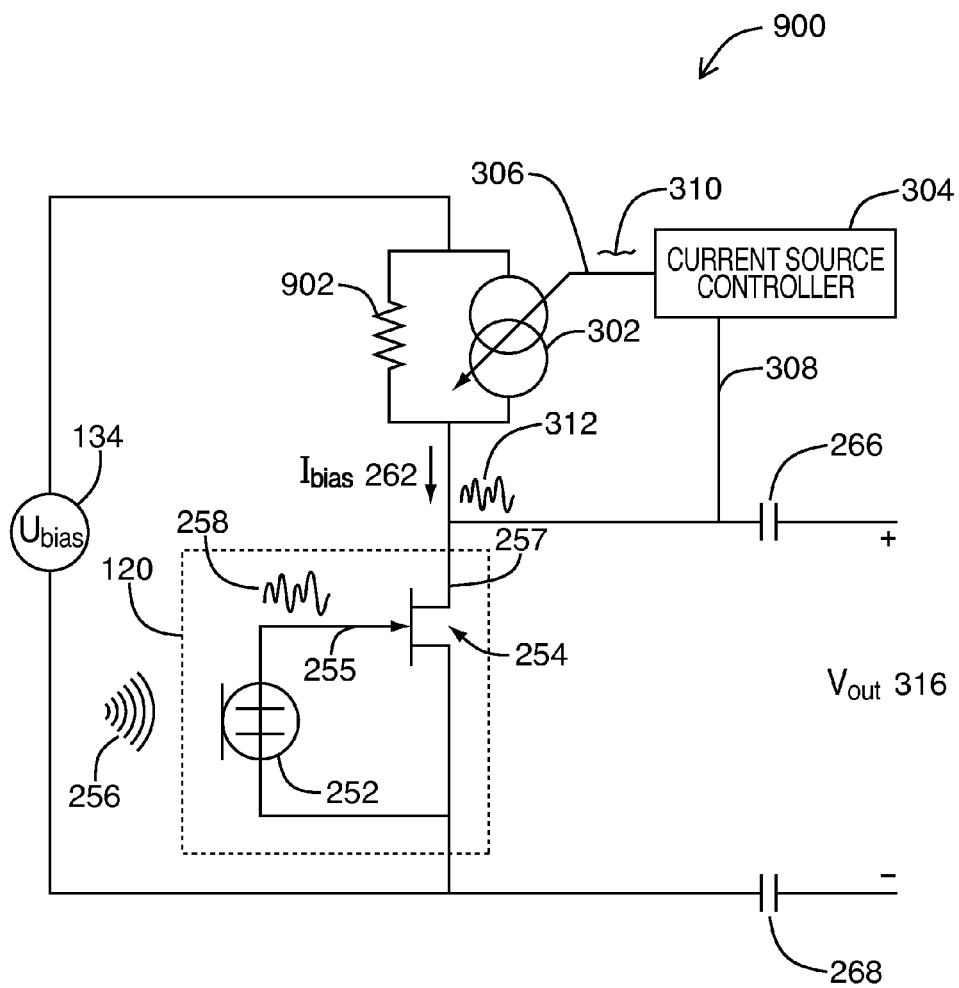
FIG. 11A is a block diagram of an alternative microphone system having an integrated low noise microphone pre-amplifier with active load element.

Referring now to FIG. 11A, there is illustrated a microphone system 900 for a microphone that provides an alternative to the microphone system 300 shown in FIG. 5. For large amplitude in the pre-amplified microphone signal 316, the microphone system 900 may trade decreased signal to noise ratio and power conversion efficiency against reduced distortion, as compared to the microphone system 300. For example, for applications that are very sensitive to electromagnetic interference (EMI) and other noise, the microphone system 300 may be more appropriate due to generally higher SNR. Any increased distortion associated with the microphone system 300 may in those cases be tolerable. However, in other cases, EMI may be less severe or more tolerable and, therefore, the reducing distortion provided by the microphone system 900 at the expense of some SNR may be desirable.

The microphone system 900 is similar to the microphone system 300, but further includes a current source resistor 902 connected in parallel to the current source 302. Otherwise the microphone system 900 is similar to and operates analogous to the microphone system 300. In some example configurations, the resistance value of the current source resistor 902 is selected so that the effective output resistance of the current source 302 is lowered overall. The lower overall output resistance reduces the amount of gain provided by the intrinsic pre-amplifier 254. While the circuit SNR will tend to be reduced as a result, as will now be explained, lowering the transistor gain can simultaneously reduce distortion of the pre-amplified microphone signal 316. However, it should be noted that significant distortion may apply only to very loud sound pressure levels (e.g., above 110 dB SPL).

Figure 11B:
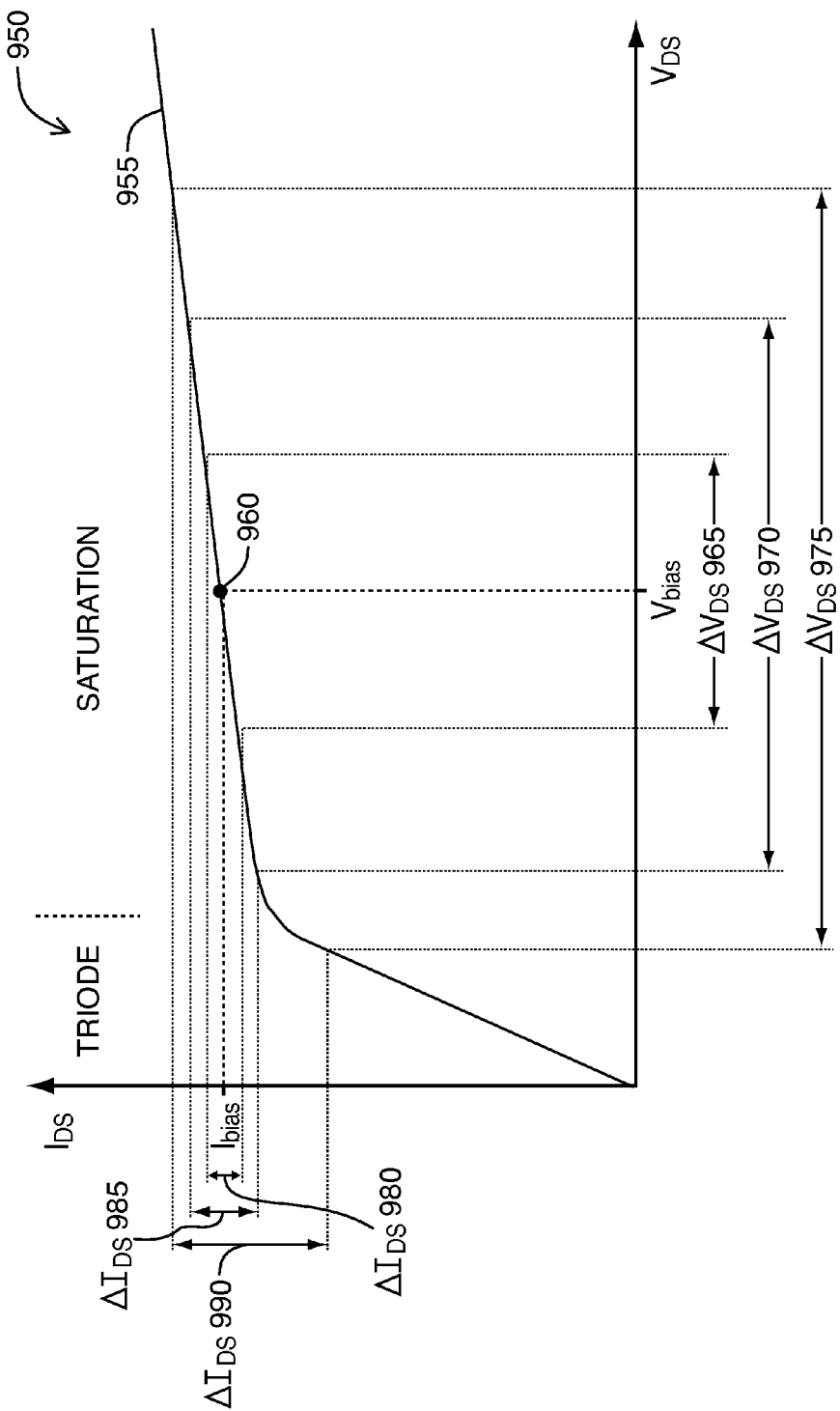
FIG. 11B is a graph showing a transfer characteristic of the microphone system shown in FIG. 11A.

Referring now to FIG. 11B, the operation of the microphone system 900 is explained using graph 950 showing the current-voltage characteristic for a typical MOS transistor. The graph 950 plots transistor drain-source voltage $V_{DS}$ and current $I_{DS}$ on the x-axis and y-axis of the graph 950, respectively, for some arbitrary gate-source voltage greater than the transistor threshold voltage (i.e., so that the transistor is on and conducting). As will be appreciated, the representative curve 955 can be separated into a triode region ($V_{DS}<V_{GS}-V_{th}$) and a saturation region ($V_{DS}>V_{GS}-V_{th}$). The non-zero slope of curve 955 in the saturation region reflects the finite output impedance of the transistor.

For operation as a non-ideal (because of its finite output impedance) voltage-controlled current source with limited signal distortion, the transistor must remain operating within the saturation region. Operating point 960 on the curve 955 reflects a representative bias point for the transistor, which is defined by a drain-source bias voltage and corresponding bias current. As explained above, the total drain-source voltage of the transistor drain includes both a dc bias component and a time-varying component due to small signal modulation of the transistor. This creates a voltage swing at the transistor drain terminal that disturbs the transistor bias point.

Three different voltage swings $\Delta V_{DS}$ are shown in FIG. 11A along with corresponding current swings $\Delta I_{DS}$. Specifically, voltage swing 965 corresponds to current swing 980, voltage swing 970 corresponds to current swing 985, and voltage swing 975 corresponds to current swing 990. Each voltage swing and corresponding current swing also reflects a slightly different voltage gain for the intrinsic pre-amplifier 254. This gives rise to noticeable distortion for large voltage swings. Assuming the same small signal modulation, the larger voltage swing is due to increased amplification of the small signal input. Greater voltage swings are also associated with greater current swings.

Voltage swing 975 illustrates a case where the voltage swing at the output terminal 314 is so large that the transistor within the intrinsic pre-amplifier 254 is driven out of saturation and into the triode region. If that happens, the transistor amplifier output can become severely distorted. One way to prevent such occurrence is to increase the dc bias voltage of the transistor using a larger supply voltage. With a large dc bias voltage, larger voltage swings at the transistor drain could be accommodated. Alternatively, for example in cases where the voltage supply level is fixed and/or limited (e.g. when battery powered), reducing the amount of gain provided by the transistor will generally lower the amount of distortion in transistor output signal by reducing the voltage swing at the output terminal. Thus, voltage swing 965 and voltage swing 970 may represent two cases where the voltage gain of the transistor is artificially reduced.

Referring back to FIG. 11A, the current source resistor 902 can be included in the microphone system 900, in parallel with current source 302, to reduce the amount of gain provided by the intrinsic pre-amplifier 254. Distortion in the pre-amplified microphone signal 316 can thereby be reduced at the expense of decreased amplification and increased dissipation loss in the current source resistor 902. However, depending on the relative performance requirements, each of the microphone system 300 or the microphone system 900 may be appropriate for different applications.

Implementation of the one or more embodiments described herein may usefully realize one or more benefits or other advantages and functionalities, some of which have been indicated above. For example, one or more of the described embodiments may improve the power supply rejection ratio of a microphone circuit by intrinsic integration of a pre-amplifier within the microphone module. The intrinsic pre-amplifier may be actively loaded and provide a gain factor that is much higher than the realizable gain factors when the intrinsic pre-amplifier is passively loaded and that does not require additional current or power consumption. The increase in the power supply rejection ratio of the microphone circuit may also be achieved without increasing the supply voltage to the microphone circuit, which may not be possible or which may result in further increases in power consumption when the microphone circuit is used in a battery powered mobile device. Accordingly, when implemented in the context of a handheld device such as cellular telephone, the above-described embodiments may advantageously be realized with hardware components that are small and lightweight, as size and weight may be design considerations of special concern for handheld devices. Moreover, the concepts described herein may be flexibly applied to a wide range of mobile devices and configurations of mobile devices (such as "flip-phone," tablet computer, etc.).

In addition, some of the described embodiments also provide improvements in power regulation and consumption within battery-powered devices, which may also be a design consideration of special concern in these devices to improve battery life. For example, elimination of a discrete amplifier provided downstream of the microphone module tends to reduce power consumption by elimination of one or more loads acting on the mobile device battery.

Various aspects of the described embodiments also provide multiple or redundant uses of different mobile device components. One example of multiple or redundant use is the transistor within the microphone module being used as both an impedance transformer and as an intrinsic pre-amplifier, which advantageously tends to reduce size and weight of the mobile device. Other aspects of the described embodiments also add robustness and reliability to the different mobile device functions, which may tend to increase user experience. Different embodiments described herein may, though not necessarily, realize one or more of these different benefits as well as other benefits not specifically noted.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative only and non-limiting.

The invention claimed is:

1. A mobile device comprising:
   a processor for controlling operation of the mobile device;
   a communication subsystem coupled to the processor;
   a microphone system for generating a pre-amplified microphone signal to be encoded and transmitted over a network by the communication subsystem, the microphone system comprising:
   a microphone comprising an acoustic sensor for generating a microphone signal representative of an acoustic signal detected in a vicinity of the microphone, and an intrinsic pre-amplifier having an input terminal coupled to the acoustic sensor to receive the microphone signal and configured to generate the pre-amplified microphone signal at an output terminal of the intrinsic pre-amplifier;
   a current source coupled to the intrinsic pre-amplifier for supplying the intrinsic pre-amplifier with a pre-amplifier bias current; and
   a current source controller coupled to the current source, the current source controller configured to control the pre-amplifier bias current supplied by the current source based on a measured operating characteristic of the intrinsic pre-amplifier to maintain the intrinsic pre-amplifier at a predetermined bias point at which the intrinsic pre-amplifier generates the pre-amplified microphone signal by amplification of the microphone signal
   wherein the current source comprises one or more voltage-controlled current sources configured to generate the pre-amplifier bias current in response to a voltage control signal generated by the current source controller based on the measured operating characteristic; and
   wherein the current source controller comprises:
   a feedback sensor coupled to the output terminal of the intrinsic pre-amplifier for comparing the measured operating characteristic of the intrinsic pre-amplifier against the predetermined bias point;
   a variable voltage supply coupled to the feedback sensor and the current source, the variable voltage supply configured to generate the voltage control signal for the current source by sweeping the voltage control signal across a range of set voltages until the feedback sensor indicates that the measured operating characteristic of the intrinsic pre-amplifier has achieved the predetermined bias point;
   a sweep sequencer coupled to the variable voltage supply and configured, upon detecting power on of the mobile device, to rest the voltage control signal to an initial set voltage and initiate the sweeping of the voltage control signal across the range of set voltages
   a digital counter for outputting a digital count value, the digital counter configured to reset the digital count value to an initial value when the sweeping of the voltage control signal is initiated, and to hold the digital count value at a final value when the measured operating characteristic of the intrinsic pre-amplifier has achieved the predetermined bias point; and
   a digital to analog converter coupled to the digital counter for converting the digital count value outputting by the digital counter into the voltage control signal.

2. The mobile device of claim 1, wherein the intrinsic pre-amplifier comprises a microphone transistor, and the predetermined bias point is a dc bias voltage at which the microphone transistor operates in a saturation region.

3. The mobile device of claim 1, wherein the current source controller comprises:
   an error signal generator coupled to the output terminal of the intrinsic pre-amplifier and configured to generate an error signal representing a difference between the predetermined bias point of the intrinsic pre-amplifier and the measured operating characteristic; and
   an integrator coupled to the error signal generator and the current source, the integrator configured to generate the voltage control signal for the current source by integrating the error signal, and the integrator having an integration frequency below a frequency range of the pre-amplified microphone signal to stabilize the intrinsic pre-amplifier at the predetermined bias point.

4. The mobile device of claim 3, wherein the current source controller comprises:
   a reference voltage generator for providing a reference voltage representing the predetermined bias point of the intrinsic pre-amplifier;
   a resistor having a first node and a second node, the first node coupled to the reference voltage generator;
   a capacitor having a third node and a fourth node, the third node of the capacitor coupled to the second node of the resistor; and
   an op-amp having a positive input terminal coupled to the output terminal of the intrinsic pre-amplifier, a negative input terminal coupled to the second node of the resistor and to the third node of the capacitor, and an op-amp output terminal coupled to the fourth node of the capacitor and to the current source for providing the voltage control signal.

5. The mobile device of claim 1, wherein the current source controller comprises:
a feedback sensor coupled to the output terminal of the intrinsic pre-amplifier for comparing the measured operating characteristic of the intrinsic pre-amplifier against the predetermined bias point; and
a switch network coupled to the current source for generating the voltage control signal, the voltage control signal comprising a plurality of switch control signals for correspondingly controlling a plurality of voltage-controlled current sources in the current source, and the switch network configured to sweep the pre-amplifier bias current across a range of currents by sequentially controlling individual voltage-controlled current sources in the plurality of voltage-controlled current sources, using the plurality of switch control signals, to supply corresponding incremental pre-amplifier bias currents to the intrinsic pre-amplifier until the feedback sensor indicates that the measured operating characteristic of the intrinsic pre-amplifier has achieved the predetermined bias point.

6. The mobile device of claim 5, wherein the current source controller comprises a sweep sequencer coupled to the switch network and configured, upon detecting power on of the mobile device, to reset each of the plurality of switch control signals to an off level at which the plurality of voltage-controlled current sources are non-conducting, and to initiate sweeping of the pre-amplifier bias current across the range of currents.

7. A microphone system for a mobile device, the microphone system comprising:
a microphone comprising an acoustic sensor for generating a microphone signal representative of an acoustic signal detected in a vicinity of the microphone, and an intrinsic pre-amplifier having an input terminal coupled to the acoustic sensor to receive the microphone signal and configured to generate a pre-amplified microphone signal at an output terminal of the intrinsic pre-amplifier;
a current source coupled to the intrinsic pre-amplifier for supplying the intrinsic pre-amplifier with a pre-amplifier bias current; and
a current source controller coupled to the current source, the current source controller configured to control the pre-amplifier bias current supplied by the current source based on a measured operating characteristic of the intrinsic pre-amplifier to maintain the intrinsic pre-amplifier at a predetermined bias point at which the intrinsic pre-amplifier generates the pre-amplified microphone signal by amplification of the microphone signal
wherein the current source comprises one or more voltage-controlled current sources configured to generate the pre-amplifier bias current in response to a voltage control signal generated by the current source controller based on the measured operating characteristic; and
wherein the current source controller comprises:
a feedback sensor coupled to the output terminal of the intrinsic pre-amplifier for comparing the measured operating characteristic of the intrinsic pre-amplifier against the predetermined bias point;
a variable voltage supply coupled to the feedback sensor and the current source, the variable voltage supply configured to generate the voltage control signal for the current source by sweeping the voltage control signal across a range of set voltages until the feedback sensor indicates that the measured operating characteristic of the intrinsic pre-amplifier has achieved the predetermined bias point;
a sweep sequencer coupled to the variable voltage supply and configured, upon detecting power on of the mobile device, to rest the voltage control signal to an initial set voltage and initiate the sweeping of the voltage control signal across the range of set voltages;
a digital counter for outputting a digital count value, the digital counter configured to reset the digital count value to an initial value when the sweeping of the voltage control signal is initiated, and to hold the digital count value at a final value when the measured operating characteristic of the intrinsic pre-amplifier has achieved the predetermined bias point; and
a digital to analog converter coupled to the digital counter for converting the digital count value outputting by the digital counter into the voltage control signal.

8. The microphone system of claim 7, wherein the intrinsic pre-amplifier comprises a microphone transistor, and the predetermined bias point is a dc bias voltage at which the microphone transistor operates in a saturation region.

9. The microphone system of claim 7 wherein the current source controller comprises:
an error signal generator coupled to the output terminal of the intrinsic pre-amplifier and configured to generate an error signal representing a difference between the predetermined bias point of the intrinsic pre-amplifier and the measured operating characteristic; and
an integrator coupled to the error signal generator and the current source, the integrator configured to generate the voltage control signal for the current source by integrating the error signal, and the integrator having an integration frequency below a frequency range of the pre-amplified microphone signal to stabilize the intrinsic pre-amplifier at the predetermined bias point.

10. The microphone system of claim 9, wherein the current source controller comprises:
a reference voltage generator for providing a reference voltage representing the predetermined bias point of the intrinsic pre-amplifier;
a resistor having a first node and a second node, the first node coupled to the reference voltage generator;
a capacitor having a third node and a fourth node, the third node of the capacitor coupled to the second node of the resistor; and
an op-amp having a positive input terminal coupled to the output terminal of the intrinsic pre-amplifier, a negative input terminal coupled to the second node of the resistor and to the third node of the capacitor, and an op-amp output terminal coupled to the fourth node of the capacitor and to the current source for providing the voltage control signal.

11. The microphone system of claim 7, wherein the current source controller comprises:
a feedback sensor coupled to the output terminal of the intrinsic pre-amplifier for comparing the measured operating characteristic of the intrinsic pre-amplifier against the predetermined bias point; and
a switch network coupled to the current source for generating the voltage control signal, the voltage control signal comprising a plurality of switch control signals for correspondingly controlling a plurality of voltage-controlled current sources in the current source, and the switch network configured to sweep the pre-amplifier bias current across a range of currents by sequentially controlling individual voltage-controlled current sources in the plurality of voltage-controlled current sources, using the plurality of switch control signals, to supply corresponding incremental pre-amplifier bias currents to the intrinsic pre-amplifier until the feedback sensor indicates that the measured operating characteristic of the intrinsic pre-amplifier has achieved the pre-determined bias point.

12. The microphone system of claim 11, wherein the current source controller comprises a sweep sequencer coupled to the switch network and configured, upon detecting power on of the mobile device, to reset each of the plurality of switch control signals to an off level at which the plurality of voltage-controlled current sources are non-conducting, and to initiate sweeping of the pre-amplifier bias current across the range of currents.

* * * * *